United States Patent
Kang

(10) Patent No.: US 7,038,934 B2
(45) Date of Patent: May 2, 2006

(54) NONVOLATILE FERROELECTRIC MEMORY DEVICE AND METHOD FOR STORING MULTIPLE BIT USING THE SAME

(75) Inventor: Hee Bok Kang, Daejon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/142,532

(22) Filed: Jun. 2, 2005

(65) Prior Publication Data
US 2005/0213366 A1 Sep. 29, 2005

Related U.S. Application Data

(62) Division of application No. 10/317,150, filed on Dec. 12, 2002, now Pat. No. 6,967,858.

(30) Foreign Application Priority Data
Dec. 13, 2001 (KR) .............................. P2001-78928

(51) Int. Cl.
G11C 11/22 (2006.01)
(52) U.S. Cl. ...................... 365/145; 365/149; 365/210
(58) Field of Classification Search ..................... None
See application file for complete search history.

(56) References Cited

U.S. PATENT DOCUMENTS

| 5,307,304 | A | | 4/1994 | Saito et al. |
| 5,903,043 | A | | 5/1999 | Ichikawa et al. |
| 5,999,438 | A | | 12/1999 | Ohsawa |
| 6,064,591 | A | | 5/2000 | Takeuchi et al. |
| 6,084,795 | A | * | 7/2000 | Nunokawa .................. 365/145 |
| 6,151,242 | A | | 11/2000 | Takashima |
| 6,151,246 | A | | 11/2000 | So et al. |
| 6,700,812 | B1 | | 3/2004 | Kang et al. |
| 6,721,199 | B1 | | 4/2004 | Kang |
| 6,856,534 | B1 | * | 2/2005 | Rodriguez et al. .......... 365/145 |

* cited by examiner

Primary Examiner—Son Mai
(74) Attorney, Agent, or Firm—Birch,Stewart,Kolasch & Birch,LLP

(57) ABSTRACT

A nonvolatile ferroelectric memory device and a method for writing and reading multiple-bit data using the same, in which multiple bit data is stored in one cell to reduce a cell layout area, thereby obtaining price competitiveness of a chip. The nonvolatile ferroelectric memory device includes a sensing amplifier block having multiple sensing amplifiers comparing multiple-level signals from main bitlines and sensing them in a multiple-bit, the sensing amplifiers being commonly used in a multiple cell array blocks to feed the sensed multiple-bit levels back and restore them in a cell, and switching transistors arranged one by one per sub bitline to sense data values of the unit cell.

14 Claims, 22 Drawing Sheets

NONVOLATILE FERROELECTRIC MEMORY DEVICE AND METHOD FOR STORING MULTIPLE BIT USING THE SAME

This application is a Divisional of application Ser. No. 10/317,150, filed on Dec. 12, 2002 now U.S. Pat. No. 6,967,858, the entire contents of which are hereby incorporated by reference and for which priority is claimed under 35 U.S.C. § 120. This application also claims the benefit of Korean Application No. P2001-78928 filed on Dec. 13, 2001, which is hereby incorporated by reference.

BACKGROUND OF THE INVENTION

1. Field of the Invention

The invention pertains to a semiconductor memory, and more particularly, to a nonvolatile ferroelectric memory device and a method for storing a multiple bit using the same.

2. Discussion of the Related Art

Generally, a nonvolatile ferroelectric memory, i.e., a ferroelectric random access memory (FRAM) has a data processing speed equal to that of a dynamic random access memory (DRAM) and retains data even when the power is off. For this reason, the nonvolatile ferroelectric memory has received much attention as a next generation memory device.

The FRAM and DRAM are memory devices having similar structures, but the FRAM includes a ferroelectric capacitor having a high residual polarization characteristic. The residual polarization characteristic permits data to be maintained even if an electric field is removed.

FIG. 1 illustrates a hysteresis loop of a related art general ferroelectric. As shown in FIG. 1, even if polarization is induced by the electric field and the electric field is removed, data is maintained at a certain level (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory is described with reference to the accompanying drawings.

FIG. 2 is a schematic diagram of a unit cell of a related art general nonvolatile ferroelectric memory device.

As shown in FIG. 2, the nonvolatile ferroelectric memory device includes a bitline B/L formed in one direction, a wordline W/L formed to cross the bitline, a plate line P/L spaced apart from the wordline in the same direction as the wordline, a transistor T1 having a gate connected with the wordline and a source connected with the bitline, and a ferroelectric capacitor FC1. A first terminal of the ferroelectric capacitor FC1 is connected with the drain of the transistor T1 and a second terminal is connected with the plate line P/L.

Data input/output operation of the above-mentioned nonvolatile ferroelectric memory device is described below.

FIG. 3A illustrates a timing diagram of a write mode operation of the related art nonvolatile ferroelectric memory device, and FIG. 3B illustrates a timing diagram of a read mode operation of the related art nonvolatile ferroelectric memory device.

During the write mode, an externally applied chip enable signal CSBpad is activated from high state to low state. At the same time, if a write enable signal WEBpad is applied from high state to low state, the write mode starts. Subsequently, if address decoding in the write mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. When a low signal is applied to the bitline, and if the signal applied to the plate line is high, a logic value "0" is written in the ferroelectric capacitor.

The reading operation of data stored in a cell is described below.

If an externally applied chip enable signal CSBpad is activated from high state to low state, all of the bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data Qs corresponding to the logic value "1" stored in the ferroelectric memory. If the logic value "0" is stored in the ferroelectric memory, the corresponding data Qs are not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in hysteresis loop of FIG. 1.1. If the data is not destroyed, "a" state is transited to the "f" state. Thus, if the sensing amplifier is enabled after a set time has elapsed, the logic value "1" is output in the case that the data is destroyed while the logic value "0" is output in the case that the data is not destroyed.

As described above, after the sensing amplifier outputs data, to recover the data to the original data, the plate line becomes inactive from high state to low state in a state that the high signal is applied to the corresponding wordline. In the aforementioned nonvolatile ferroelectric memory device, data logic "1" or "0" is written in one cell.

The above-mentioned related art nonvolatile ferroelectric memory device has a problem in that since the data of logic "1" or "0" is written, it is difficult to reduce the layout area. That is, the related art fails to allow multiple conventional memory cells to be replaced with one memory cell. Therefore, reductions in chip size and the price competitiveness of the chip are not easily obtained through the related art technology.

SUMMARY OF THE INVENTION

Accordingly, the invention is directed to a nonvolatile ferroelectric memory device and a method for writing and reading multiple bit data using the same that substantially obviates one or more problems due to limitations and disadvantages of the related art.

The invention, in part, provides a nonvolatile ferroelectric memory device and a method for writing and reading multiple-bit data in which multiple-bit data is stored in one cell to reduce a cell layout area, thereby obtaining price competitiveness of a chip.

The invention, in part, pertains to a nonvolatile ferroelectric memory device which includes: a plurality of cell array blocks provided with a plurality of sub cell array blocks having a plurality of unit cells; a plurality of main bitlines arranged in the sub cell array blocks in one direction for each unit of column; a plurality of sub bitlines connected with one terminal of the unit cells to induce a voltage in the unit cells and arranged along the main bitlines; a sensing amplifier block consisting of a plurality of sensing amplifiers comparing multiple-level signals from the main bitlines and sensing them in a multiple-bit state, the sensing amplifiers being commonly used in the cell array blocks to feed the sensed multiple-bit states back and restore them in the cells; and switching transistors respectively arranged per sub bitline to current-sense multiple-level data values of the unit cells by controlling a current flow depending on multiple-level voltages induced in the sub bitline and transmitting the multiple-level voltages to the main bitlines, each of the switching transistors having a gate connected with the sub bitlines, a drain connected with the main bitlines, and a source connected with a ground voltage terminal.

In the invention, if the multiple-bit is 2-bit, then the sensing amplifier block includes: first to third sensors receiving multiple-level data output through the main bitlines through a data bus and comparing the multiple-level data with reference signals of different levels, an encoder encoding signals output through the first to third sensors and outputting the encoded signals to first and second input/output buses, a decoder outputting output signals of the encoder when the data is restored, a D/A converter outputting data of the decoder to the data bus, and first to third reference generators outputting different corresponding levels to input terminals of the first to third sensors.

In the invention, if the multiple-bit is 3-bit, then the sensing amplifier block includes: first to seventh sensors receiving multiple-level data output from the main bitlines through a data bus (the first to seventh sensors comparing the multiple-level data with reference signals of different levels), an encoder encoding signals output through the first to seventh sensors (the encoder outputting the encoded signals to first to third input/output buses), a decoder outputting output signals of the encoder when the data is restored, a D/A converter outputting data of the decoder to the data bus, and first to seventh reference generators outputting different corresponding levels to input terminals of the first to seventh sensors.

In the invention, if the multiple-bit is n-bit, then the sensing amplifier block includes: first to $(2^n-1)$th sensors receiving multiple-level data output from the main bitlines through a data bus (the first to $(2^n-1)$th sensors comparing the multiple-level data with reference signals of different levels), an encoder encoding signals output from the first to $(2^n-1)$th sensors and outputting the encoded signals to first to $(2^n-1)$th input/output buses, a decoder outputting output signals of the encoder when the data is restored, a D/A converter outputting data of the decoder to the data bus at multiple-level voltages, and first to $(2^n-1)$th reference generators outputting different corresponding levels to input terminals of the first to $(2^n-1)$th sensors.

In an embodiment of the invention, the reference generators include a plurality of ferroelectric capacitors having first electrodes and second electrodes arranged in parallel (the first electrodes being commonly connected to a reference plate line, and the second electrodes being commonly connected to a reference voltage sensing line which is a storage node), a reference level control portion arranged between the second electrodes of the ferroelectric capacitors and the reference voltage sensing line to control the reference level change due to process change after an optimal ferroelectric capacitor is arranged, a level initiating portion having a gate, a drain terminal, and a source terminal, the gate being applied with a reference equalizer signal, and the drain and source terminals being connected with the reference voltage sensing line and the ground voltage terminal, respectively, and a reference voltage output portion having a load PMOS transistor and an NMOS transistor connected in series between a power source terminal and the ground voltage terminal, and generating a reference voltage in a common node between the PMOS transistor and the NMOS transistor. Also, the reference level control portion comprises a transfer gate between the second electrodes of the ferroelectric capacitors and the reference voltage sensing line. The load PMOS transistor has a gate grounded, and the NMOS transistor has a gate turned on/off under the control of the reference voltage sensing line. The level initiating portion can comprise a NMOS transistor.

In a preferred embodiment of the invention, the ferroelectric memory device comprises a plurality of main bitline load controllers arranged in the uppermost area and the lowest area of the sub cell array blocks and middle portions of the sub cell array blocks, having one end connected to the main bitlines and the other end connected to a high level applying terminal. Also, there are at least two of the sub cell array blocks arranged between the main bitline load controllers. The main bitline load controllers can comprise PMOS transistors.

In a preferred embodiment of the invention, the sub cell array blocks have a hierarchical folded bitline structure, so that the unit cells are alternately arranged so as not to overlap with one another if the cell array blocks are folded around the main bitlines, cells in each row are arranged per two columns, cells in each column are arranged per two rows, and a plate line is commonly used between two wordlines. Alternatively, the sub cell array blocks have a hierarchical open bitline structure, so that the unit cells are arranged so as to overlap with one another if the cell array blocks are folded around the main bitlines, cells in each row are arranged per column, and cells in each column are arranged per row.

The invention, in part, pertains to a method for writing multiple-bit data using the nonvolatile ferroelectric memory device which includes the steps of writing high data in all the cells, and controlling voltages of the plate line and the sub bitlines to write multiple-bit data of n-bit in the cells.

In another aspect of the invention, a method for reading multiple-bit data using the nonvolatile ferroelectric memory device includes the steps of comparing a voltage value of a multiple-level transferred to the main bitlines with an output value of $2^n-1$ reference generators through first to $(2^n-1)$th sensors, encoding output signals of the sensors and outputting the encoded signals in n-bit, and decoding a data value of the encoded n-bit, digital-to-analog converting the decoded value and restoring the resultant value to the cells through the main bitlines and the sub bitline.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principles of the invention.

DETAILED DESCRIPTION

Advantages of the present invention will become more apparent from the detailed description given herein after. However, it should be understood that the detailed description, while indicating preferred embodiments of the invention, are given by way of illustration only, since various changes and modifications within the spirit and scope of the invention will become apparent to those skilled in the art from this detailed description.

Details of the preferred embodiments of the invention are discussed below, examples of which are illustrated in the accompanying drawings. Wherever possible, the same reference numbers are used throughout the drawings to refer to the same or like parts.

In the invention's nonvolatile ferroelectric memory device and a method for writing and reading multiple-bit, multiple-bit data is written and read in a cell of FRAM.

Since voltage dependence is high in a write mode operation, multiple-bit data is stored in a cell by using the voltage dependence.

In other words, respective voltage levels are respectively adjusted to storage voltages, and the maximum bitline sensing voltage is induced in the bitline under the condition of small capacitance load. This sensing voltage is used as an input voltage to a gate of a fourth switching transistor constituting an NMOS transistor connected to a main bitline, so that the current output from the main bitline is controlled. Thus, the sensing voltage of the main bitline becomes more stable and its sensitivity is improved.

Furthermore, in the write mode, high data is written in the cell. The data written in the cell is readjusted by the voltage level, which depends on the written data level.

By the above method, four or more data levels are stored in one memory cell, so that data of 2 bits or greater can be stored therein.

By the device and method according to the invention, multiple conventional memory cells can be replaced with one memory cell. Therefore, the chip size can be remarkably reduced and improved price competitiveness of the chip can easily be obtained.

Figure 1:
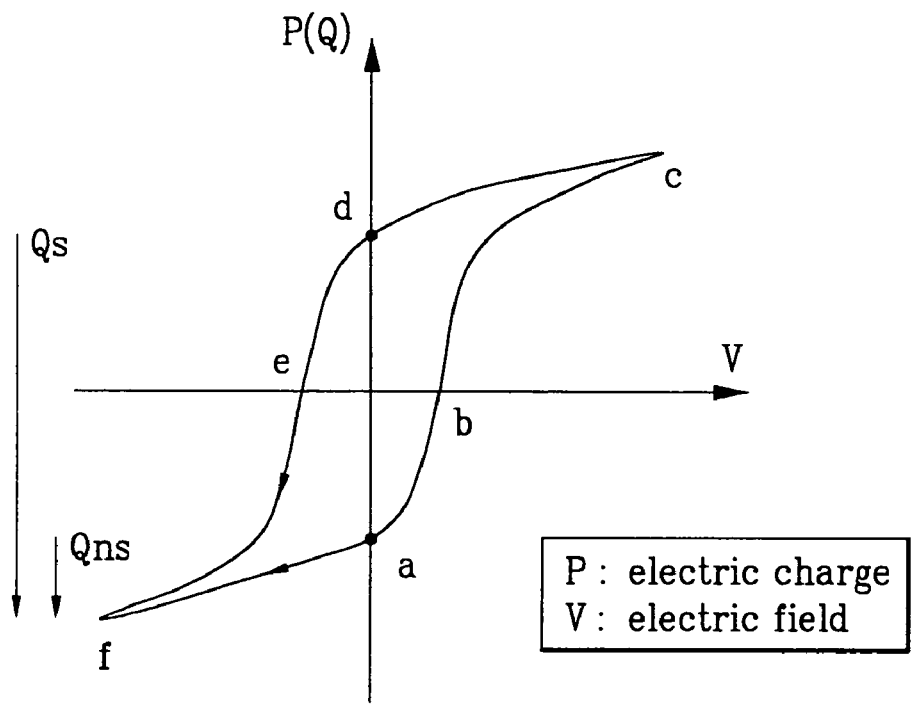
FIG. 1 illustrates a hysteresis loop of a related art general nonvolatile ferroelectric memory device.
Figure 2:
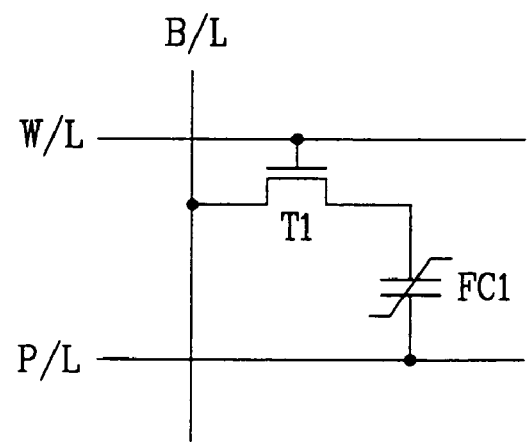
FIG. 2 is a schematic diagram of a unit cell of a related art general nonvolatile ferroelectric memory device.
Figure 3A:
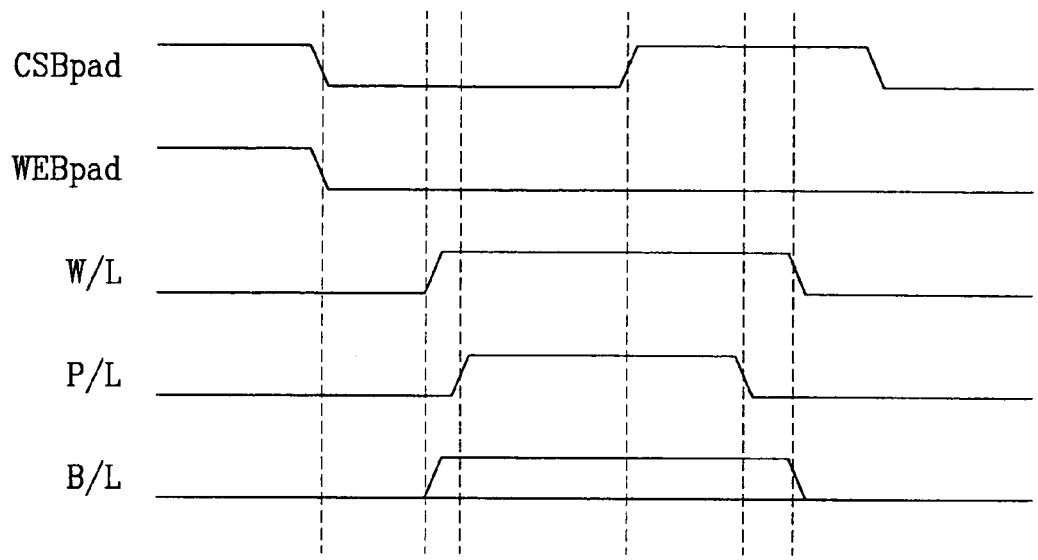
FIG. 3A is a timing diagram of a write mode operation of a related art ferroelectric memory.
Figure 3B:
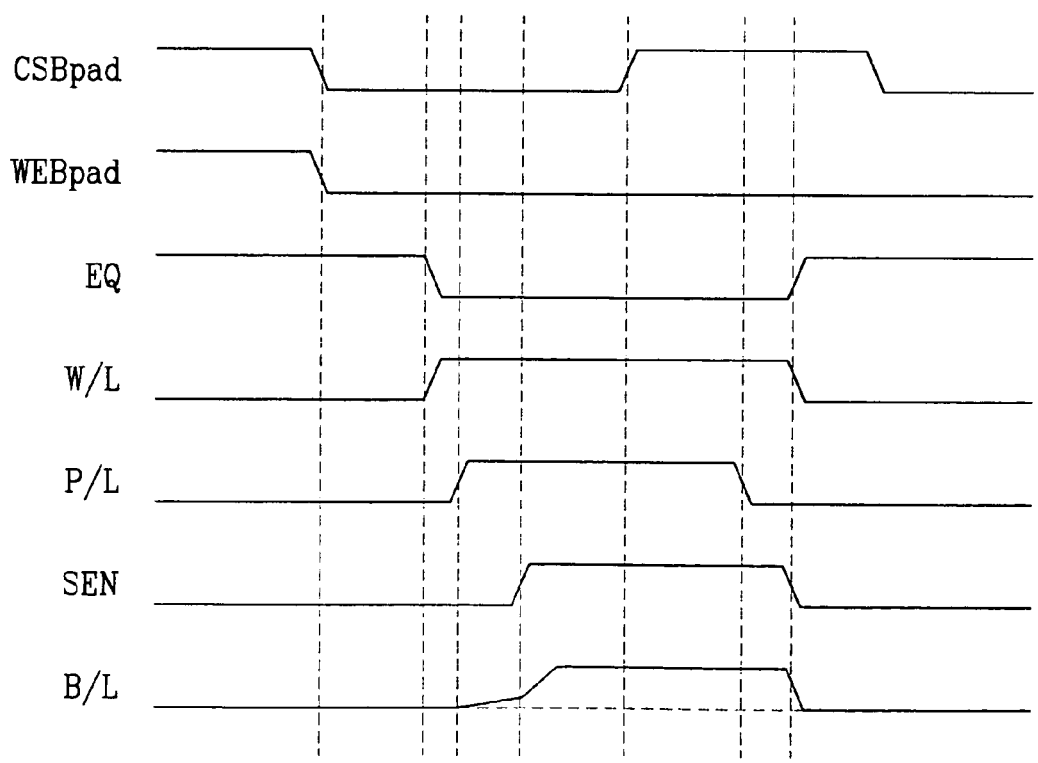
FIG. 3B is a timing diagram of a read mode operation of the related art ferroelectric memory.
Figure 4A:
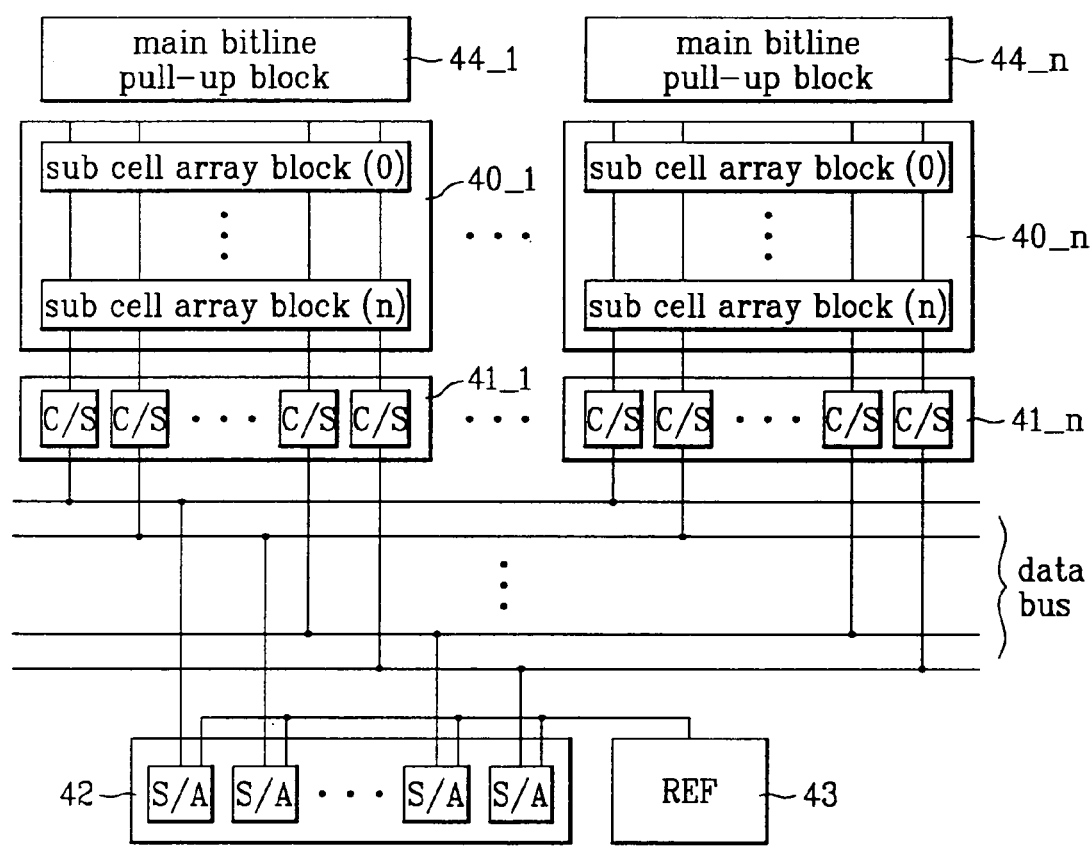
FIGS. 4A and 4B are schematic views of a nonvolatile ferroelectric memory device according to the invention.
Figure 4B:
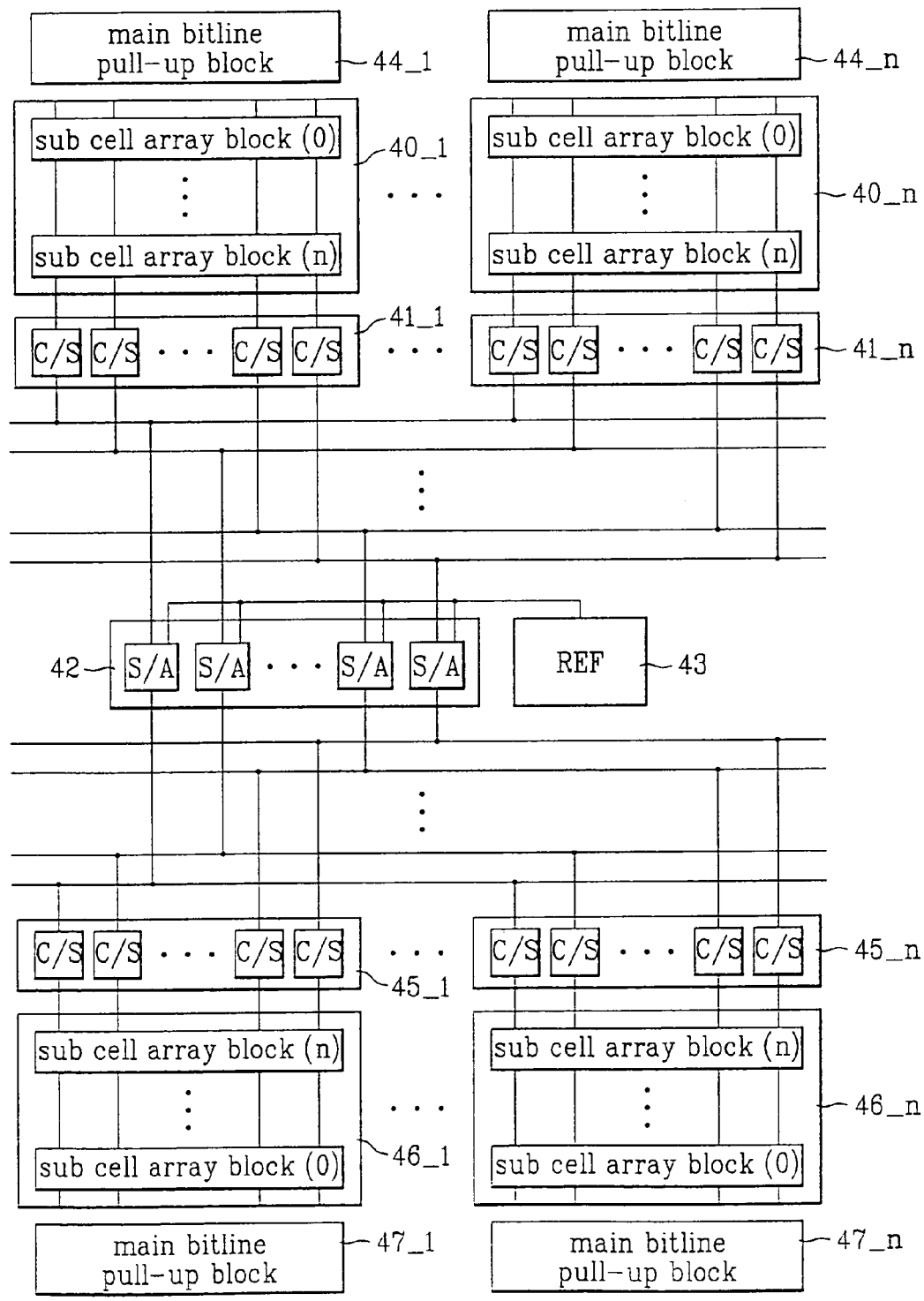

FIGS. 4A and 4B are schematic views of the nonvolatile ferroelectric memory device according to the invention.

As shown in FIG. 4A, the nonvolatile ferroelectric memory device according to the present invention includes a plurality of cell array blocks $40\_1$~$40\_n$, a plurality of column selector blocks $41_{1}$~$41\_n$ corresponding to the respective cell array blocks, a sensing amplifier block 42 commonly used in the cell array blocks, a reference generator 43 commonly connected with a plurality of sensing amplifiers in the sensing amplifier block 42, and a main bitline pull-up block 44 for pulling up a main bitline of each cell array.

Each of the cell array blocks includes multiple sub cell array blocks. The sub cell array blocks include multiple main bitlines and sub bitlines that have one-to-one correspondence to the main bitlines (See FIGS. 12 and 13).

The main bitline of each cell array block is connected with a column selector C/S in the column selector block one to one, and multiple output signals which passed through the column selector are connected with each sensing amplifier in the sensing amplifier block 42 through a common signal bus line.

The number of the sensing amplifiers in the sensing amplifier block 42 is identical to the number of signal buses.

As shown in FIG. 4B, a plurality of cell array blocks of the aforementioned nonvolatile ferroelectric memory device are arranged at upper and lower portions of the sensing amplifier block 42 and the reference generator 43 around them. Also, the main bitline pull-up block 47 and the column selector 45 are arranged to correspond to the cell array blocks.

At this time, the signal bus lines are arranged at the upper cell array block and the lower cell array block to correspond to the number of the sensing amplifiers.

The structure according to the cell array blocks of FIGS. 4A and 4B provided with multiple main bitline load controllers will now be described with reference to FIG. 5.

Figure 5:
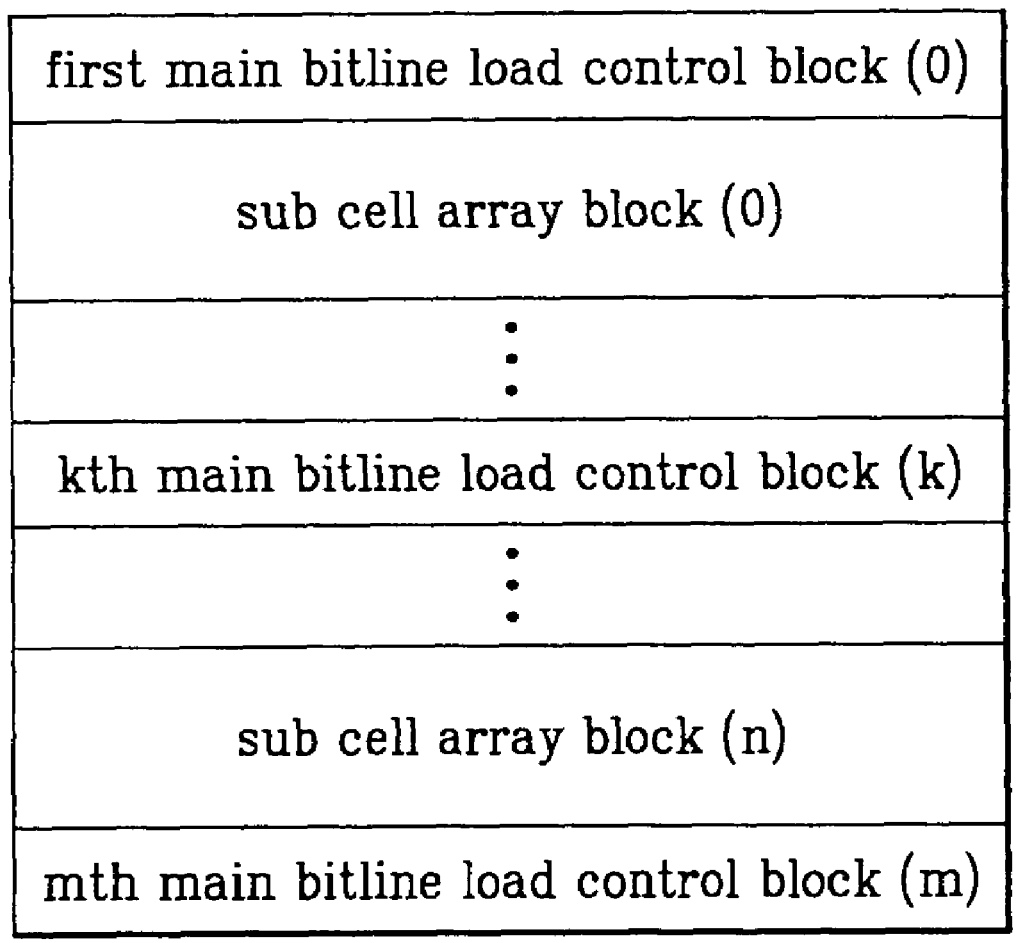
FIG. 5 is a schematic diagram of a cell array block of FIGS. 4A and 4B.

As shown in FIG. 5, the multiple main bitline load controllers are arranged in the respective sub cell array blocks. At this time, at least two or more sub cell array blocks are arranged between the main bitline load controllers.

In other words, two or more sub cell array blocks are arranged between the first main bitline load controller (0) and the kth main bitline load controller (k), and two or more sub cell array blocks are arranged between the kth main bitline load controller k and the mth main bitline load controller m.

Figure 6:
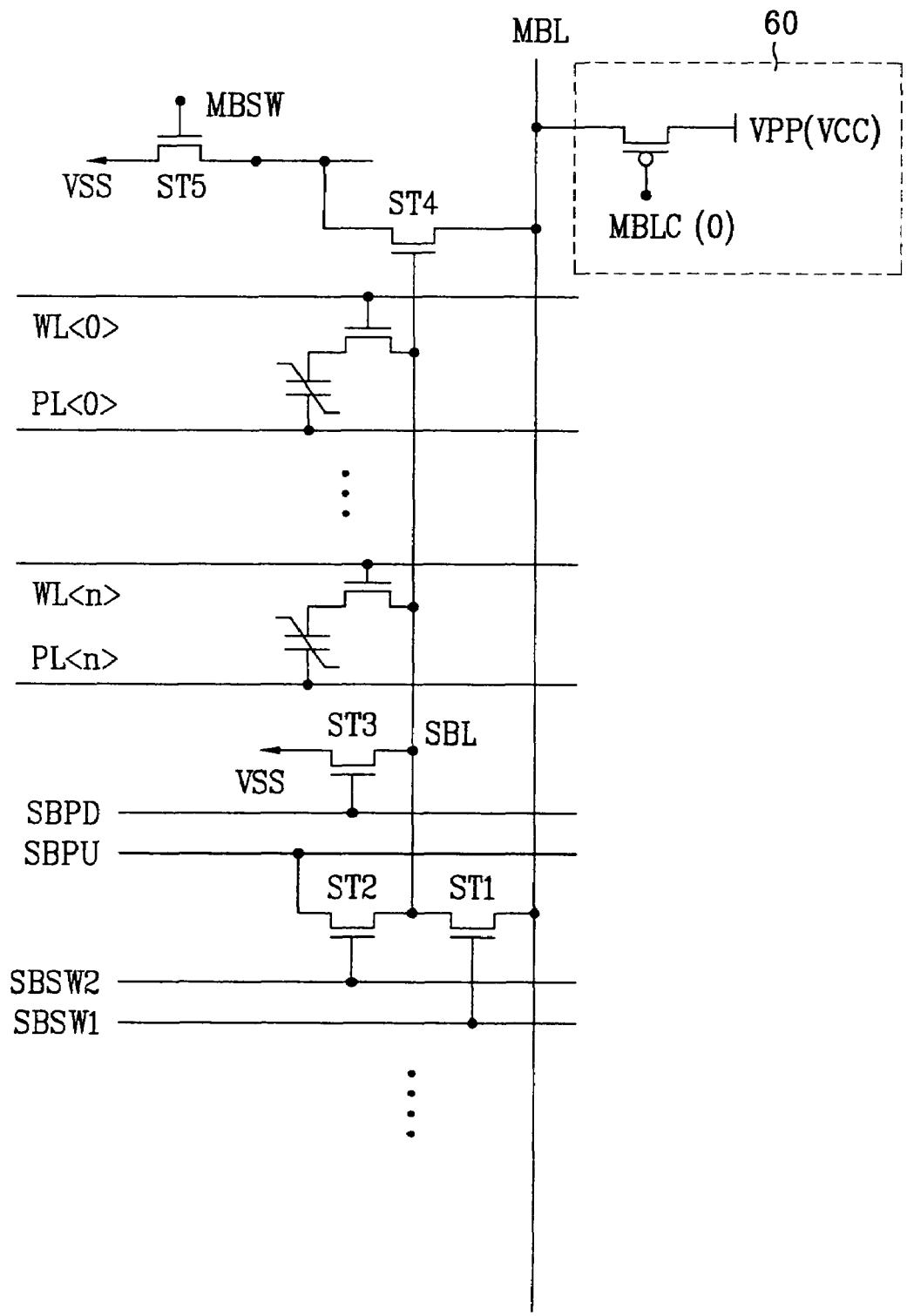
FIG. 6 is a circuit diagram of a cell array block having a main bitline load controller according to the invention.

FIG. 6 is a circuit diagram of the sub cell array block having an open bitline structure.

The main bitline load controller 60, as shown in FIG. 6, constitutes a PMOS transistor. A source terminal of the PMOS transistor is connected with the main bitline, its drain terminal is always applied with a VPP or VCC voltage, and its gate terminal is applied with a main bitline load control signal MBLC.

The circuit structure according to first and second methods of the sub cell array block will be described below.

Figure 7:
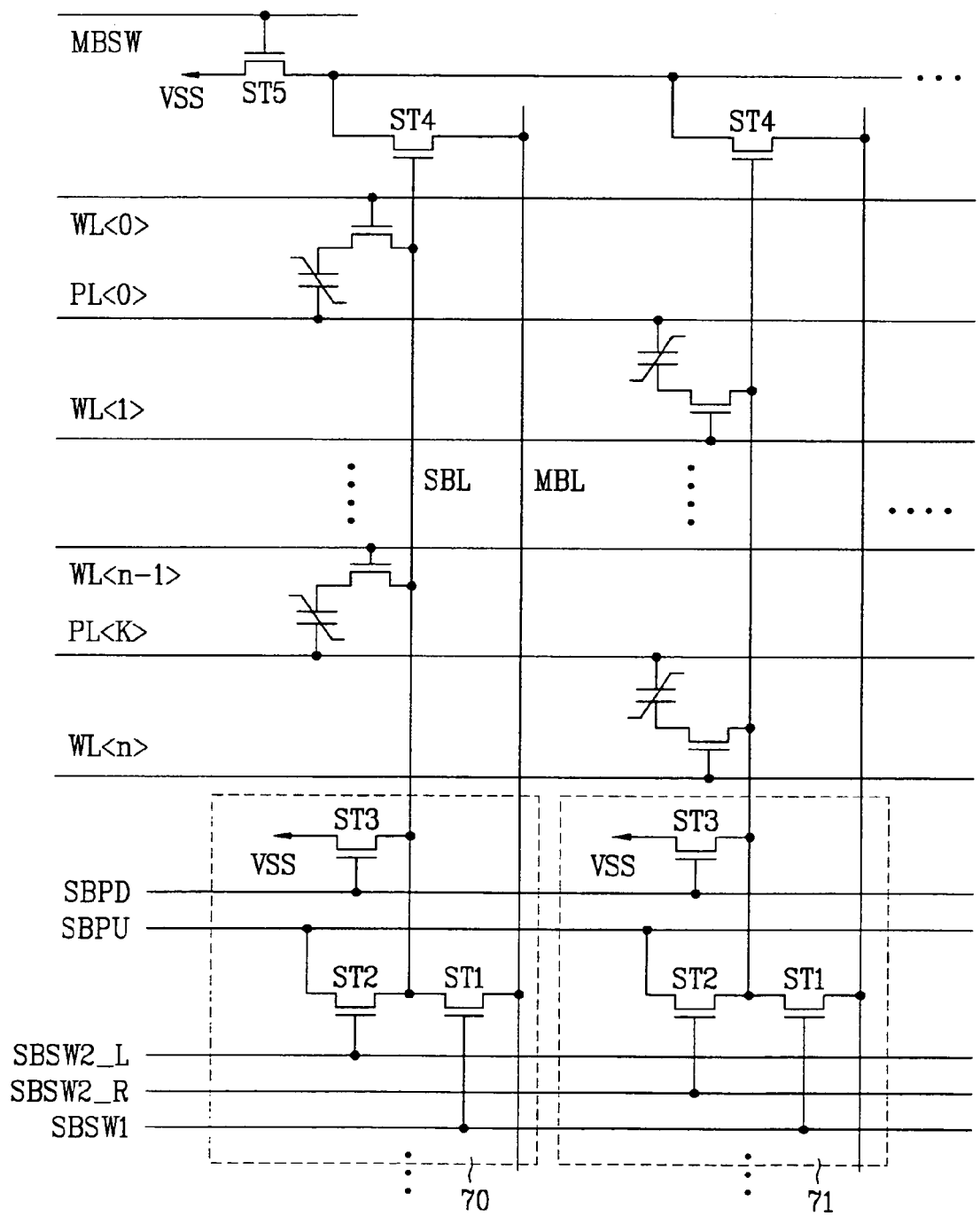
FIG. 7 is a circuit diagram according to a first method of a sub cell array block according to the invention.
Figure 8:
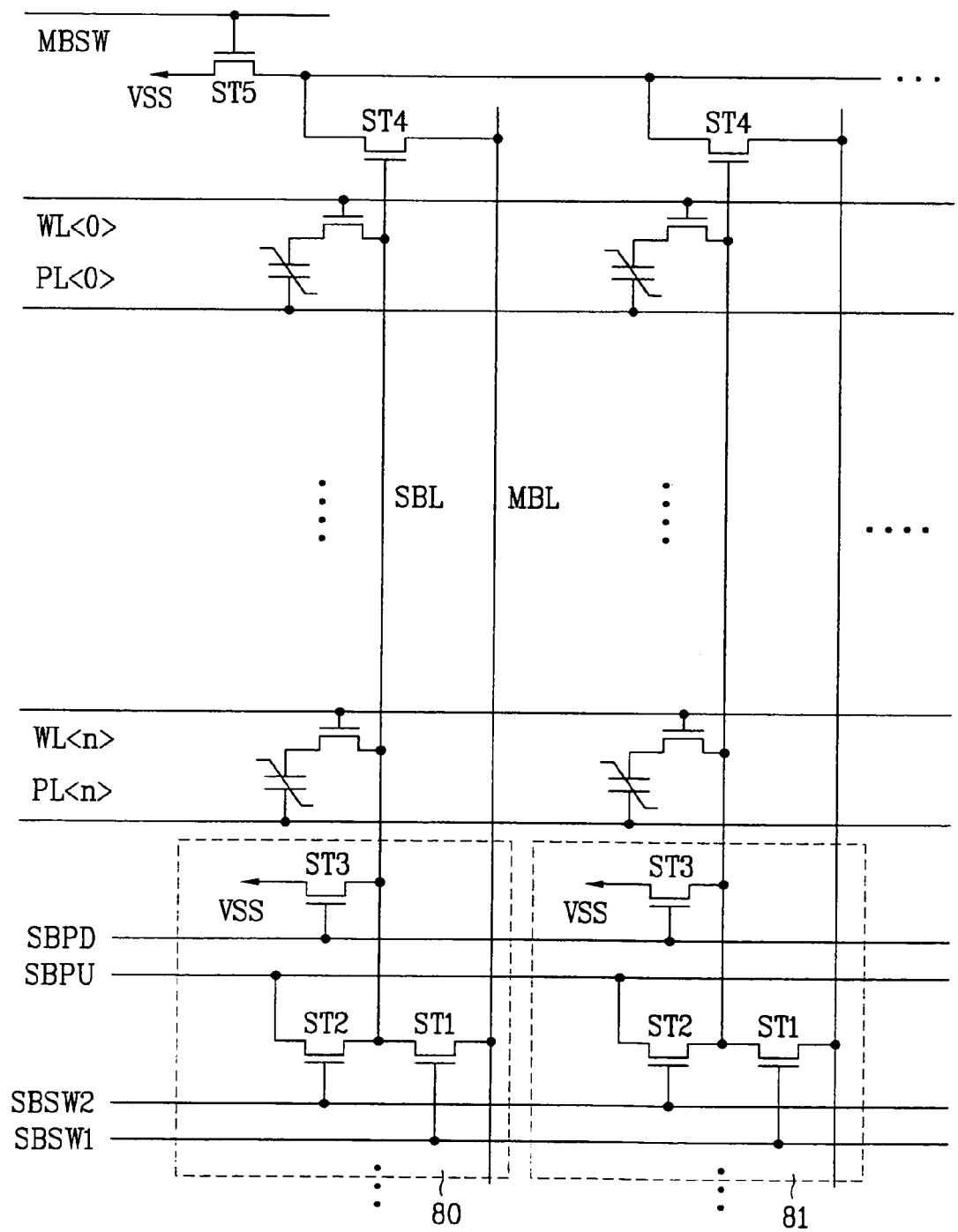
FIG. 8 is a circuit diagram according to a second method of a sub cell array block according to the invention.

FIG. 7 is a circuit diagram according to the first method of the sub cell array block according to the invention, and FIG. 8 is a circuit diagram according to the second method of the sub cell array block according to the invention.

First, the circuit diagram according to the first method of the sub cell array block will be described. The cell data are sensed by current amount. The sub cell array block has a folded bit line structure. A plate line is commonly used between two wordlines.

In more detail, referring to FIG. 7, the sub cell array block includes n+1 row and n+1 column. The sub cell array block includes a plurality of cells arranged in a plurality of row directions and a plurality of column directions.

A unit cell per two columns is arranged in each row direction, and a unit cell per two rows is arranged in each column direction.

Therefore, once one wordline and one plate line are activated, the cell connected with the odd numbered bitline or the even numbered bitline is only selected. The other odd or even numbered bitlines are used as reference lines.

In more detail, multiple main bitlines MBL<0>, MBL<1>, . . . , MBL<n> are arranged in one direction, and sub bit lines SBL<0>, SBL<1>, . . . , SBL<n> are arranged in the same direction as the main bitlines MBL<0>, MBL<1>, . . . , MBL<n> to connect with the unit cell in each sub cell array block. Multiple wordlines and a plurality of plate lines are arranged to be perpendicular to the main bitlines MBL<0>, . . . , MBL<n>.

At this time, one plate line is arranged per two wordlines. That is, the unit cells in a column direction are connected with one plate line.

A sub bitline pull-down (SBPD) line, a first sub bitline switching signal SBSW1 line, second left and right sub bitline switching signal SBSW2_L and SBSW2_R lines, and a sub bitline pull-up SBPU line are arranged in the same direction as the wordlines and the plate lines.

Switching control blocks 70, 71, . . . are arranged to correspond to one main bitline and one sub bitline under the control of the SBPD line, the SBSW1 line, the SBSW2_L line, the SBSW2_R line, and the SBPU line. The switching control blocks 70, 71, . . . control whether the selected cell will be connected with the main bitline or the sub bitline, and control a voltage applied to the ferroelectric capacitor of the selected cell.

Each of the switching control blocks 70, 71, . . . includes first, second, and third switching transistors ST1, ST2, and ST3.

The first switching transistor ST1 has a gate connected with the SBSW1 line, one electrode connected with the main bitline, and the other electrode connected with the sub bitline.

The second switching transistor ST2 has a gate connected with the SBSW2_L line or the SBSW2_R line, one electrode connected with the sub bitline, and the other electrode connected with the SBPU line.

The third switching transistor ST3 has a gate connected with the SBPD line, one electrode connected with the sub bitline, and the other electrode connected with a ground voltage terminal VSS.

A fourth switching transistor ST4, which is an NMOS transistor, has a gate connected with the sub bitline, a drain and a source respectively connected between the main bitline MBL and the ground voltage terminal VSS. A fourth switching transistor ST4 is arranged per sub bitline.

A voltage corresponding to the data stored in the cell is applied to the sub bitline of each sub cell array block. The voltage is applied to the gate electrode of the fourth switching transistor ST4 through the sub bitline.

The current value in the fourth switching transistor ST4 depends on the size of the voltage corresponding to the data stored in the cell. The data of the cell can be sensed by comparing the voltage of the main bitline connected with the drain terminal of the fourth switching transistor with the reference value.

Among the multiplicity of sub bitlines SBL, one sub bitline SBL is selected by activating one of the SBSW1 signals. Thus, the load in the bitline can be reduced to a level of one sub bitline load.

Also, the sub bitline SBL is adjusted to the ground voltage level if the SBPD signal is activated by the SBPD line.

The SBPU adjusts the power which will be supplied to the SBL. A higher voltage than the VCC voltage is generated during low voltage operation.

The SBSW2_L and the SBSW2_R serve to switch the signal flow between the SBPU and the SBL. The multiplicity of cells are connected with their respective SBLs.

A fifth switching transistor ST5, which is an NMOS transistor, prevents current leakage during the data writing operation.

The fifth switching transistor ST5 has a gate terminal connected with the main bitline switching signal MBSW, a drain terminal commonly connected with the respective source terminals of the fourth switching transistor ST4, and a source terminal connected with the ground voltage terminal VSS. A fifth switching transistor ST5 is arranged per sub cell array block.

The circuit diagram according to the second method of the sub cell array block is described below.

As shown in FIG. 8, a pair of wordline and plate lines are arranged, and each of the cells is arranged in the wordline and plate line pairs and the sub bit line. The gate of the second switching transistor ST2 of each switching block operates under the control of the second sub bitline switching signal SBSW2 line. The circuit according to the second method of the sub cell array block has a hierarchical open bitline cell structure in which unit cells overlap one another when the sub cell array block is folded around the bitline.

Next, the circuit structure of the main bitline pull-up controller and the column selector will be described.

Figure 9:
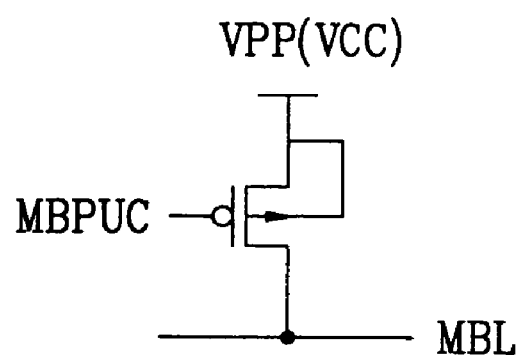
FIG. 9 is a circuit diagram of a main bitline pull-up controller according to the invention.

As shown in FIG. 9, the respective main bitline pull-up controller shown in FIGS. 4A and 4B includes a PMOS transistor. The drain terminal of the PMOS transistor connects with the main bitline MBL, its source terminal connects with the power source terminal, and its gate terminal is arranged so that the main bitline pull-up control signal is applied thereto. At this time, VCC or VPP is supplied to the gate terminal.

The main bitline pull-up controller pulls up the main bitline during precharge operation.

Figure 10:
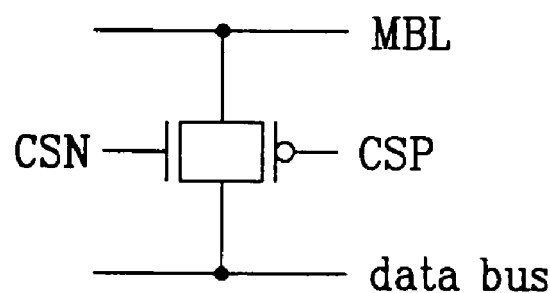
FIG. 10 is a circuit diagram of a column selector according to the invention.

The respective column selectors C/S shown in FIGS. 4A and 4B do not generate voltage drop between the main bitline and the data line. As shown in FIG. 10, the column selector includes a transfer gate consisting of an NMOS transistor and a PMOS transistor, whose drain terminal is connected with the main bitline and source terminal is connected with the data bus.

The main bitline MBL is selected by the column selector C/S and is pulled up by the main bitline pull-up block when it is not driven.

The sensing amplifier for sensing (reading) multiple-bit data and its peripheral circuit in the nonvolatile ferroelectric memory device according to the invention is described below. The sensing amplifier and its peripheral circuit is described particularly for 2-bit data, 3-bit data, or n-bit data being stored in the cell.

Figure 11:
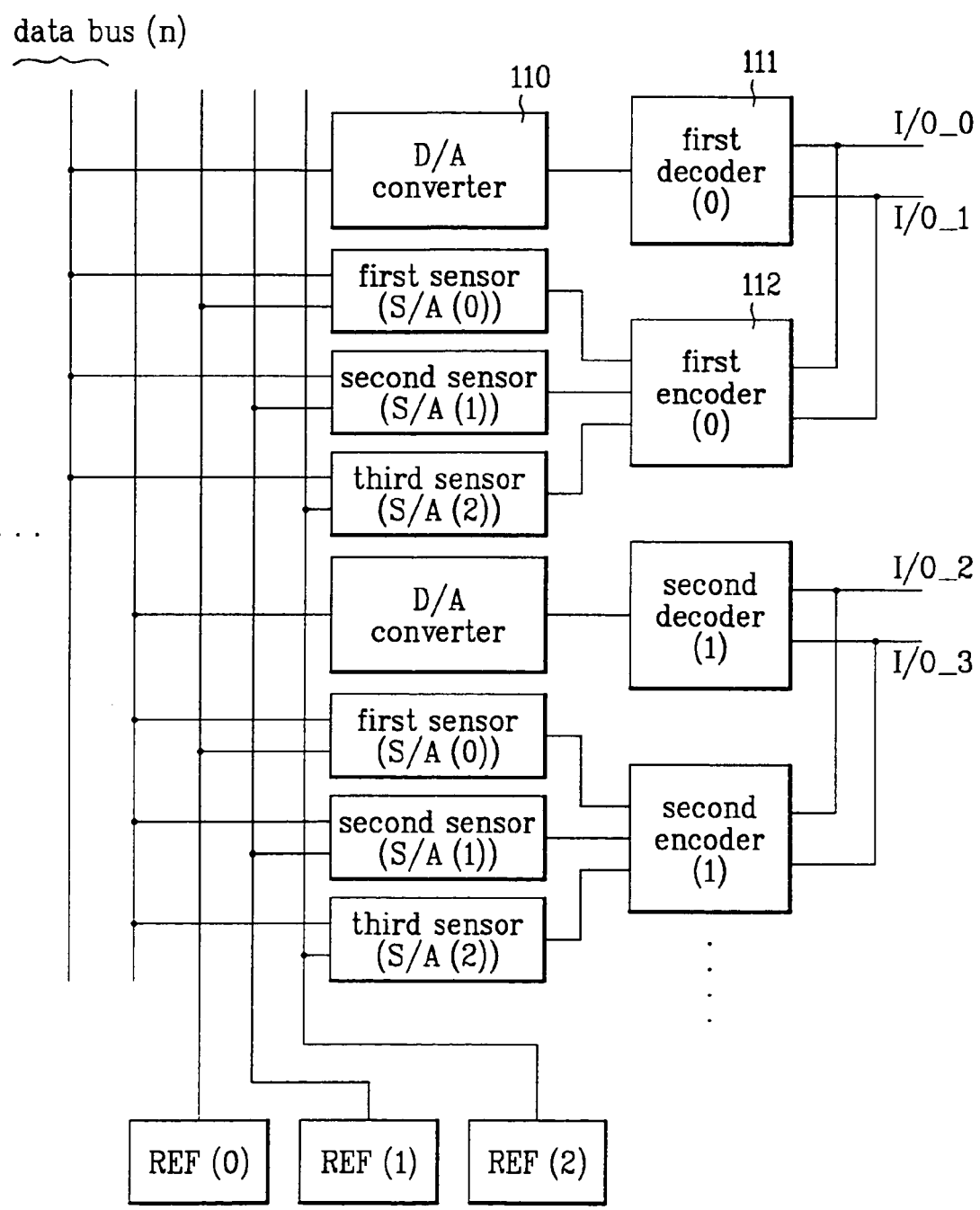
FIG. 11 is a block diagram of a sensing amplifier for sensing 2-bit data stored in a cell.

As shown in FIG. 11, the sensing amplifier for outputting the data stored in a 2-bit type cell includes first to third sensors S/A(0), S/A(1) and S/A(2) comparing and outputting multiple-level data from the data bus. A first encoder 112 encodes signals output from the first to third sensors S/A(0), S/A(1) and S/A(2) to output to first and second input/output buses I/O_O and I/O_1. A first decoder 111 outputs output signals of the encoder to a digital-to-analog converter 110 when restoring the data, and the digital-to-analog converter 110 outputs data of the first decoder 111 to the data bus.

Also, to sense the data using the first to third sensors S/A(0), S/A(1) and S/A(2), reference generators having different levels are required. Therefore, first to third reference generators REF(0), REF(1) and REF(2) outputting different levels are provided at corresponding input terminals of the first to third sensors S/A(0), S/A(1) and S/A(2).

A multiplicity of data buses are provided so that one data bus includes one digital-to-analog converter, the first to third sensors S/A(0), S/A(1) and S/A(2), the encoder, the decoder, and two input/output buses.

In other words, one data bus, the digital-to-analog converter, the first to third sensors S/A(0), S/A(1) and S/A(2), the encoder, the decoder, and two input/output buses are separately provided, while the first to third reference generators REF(0), REF(1) and REF(2) are commonly used.

Figure 12:
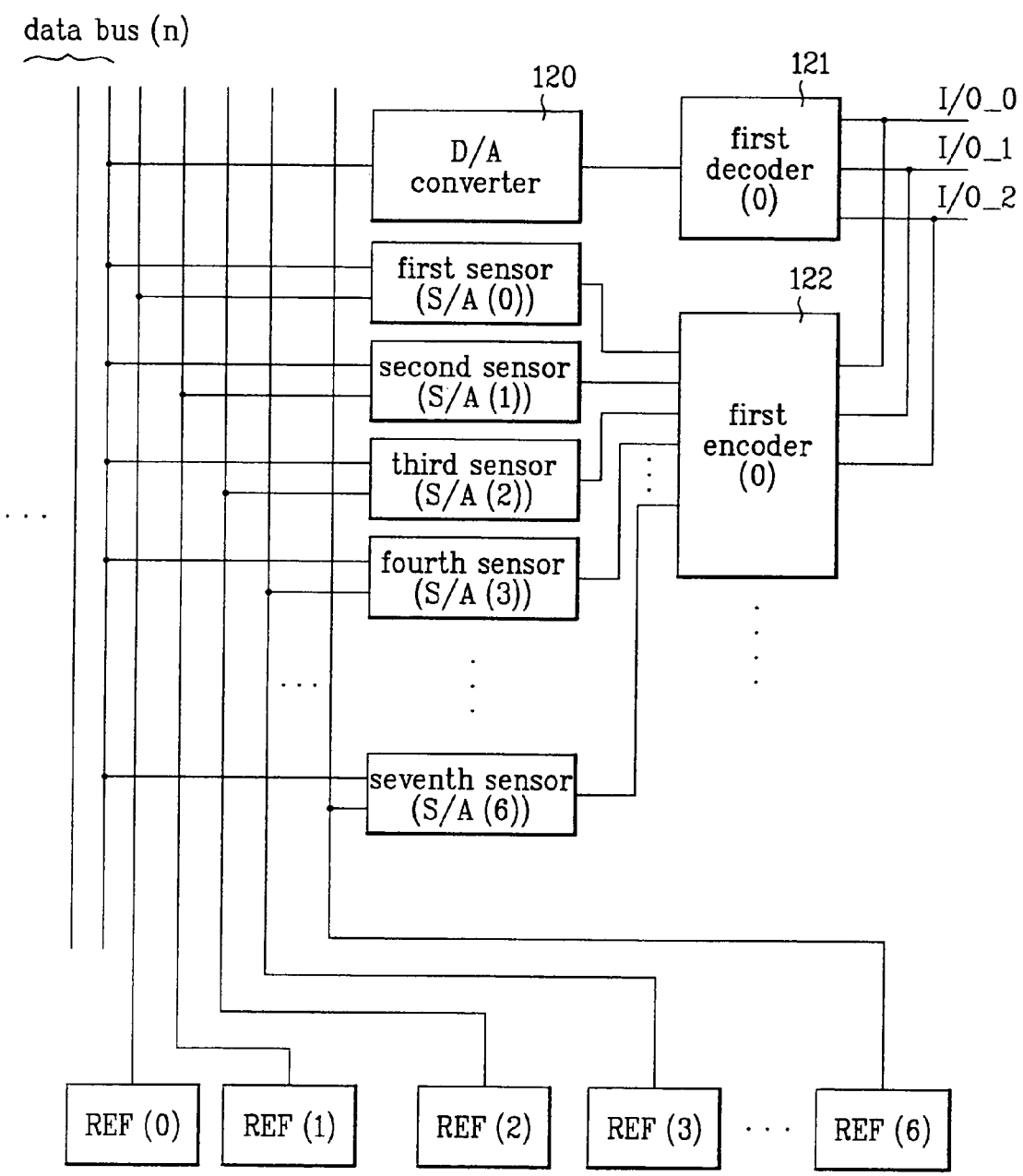
FIG. 12 is a block diagram of a sensing amplifier for sensing 3-bit data stored in a cell.

The sensing amplifier for outputting the data stored in a 3-bit type cell, as shown in FIG. 12, includes first to seventh sensors S/A(0)~S/A(6) comparing and outputting data from the data bus, a first encoder 122 encoding signals output from the first to seventh sensors S/A(0)~S/A(6) to output them to first and third input/output buses I/O_$_0$, I/O_1 and I/O_2, a first decoder 122 outputting output signals of the first encoder 122 to a digital-to-analog converter 120 when restoring the data, and the digital-to-analog converter 120 outputting data of the first decoder 121 to the data bus.

Also, to sense the data using the first to seventh sensors S/A(0)~S/A(6), reference generators having different levels are required. Therefore, first to seventh reference generators REF(0)~REF(6) outputting different levels are provided at input terminals of the first to seventh sensors S/A(0)~S/A(6).

A multiplicity of data buses are provided so that one data bus includes one digital-to-analog converter, the first to seventh sensors S/A(0)~S/A(6), the encoder, the decoder, and three input/output buses.

In the 3-bit type sensing amplifier, one data bus, the digital-to-analog converter, the first to seventh sensors S/A(0)~S/A(6), the encoder, the decoder, and three input/output buses are separately provided, while the first to seventh reference generators REF(0)~REF(6) are commonly used.

Figure 13:
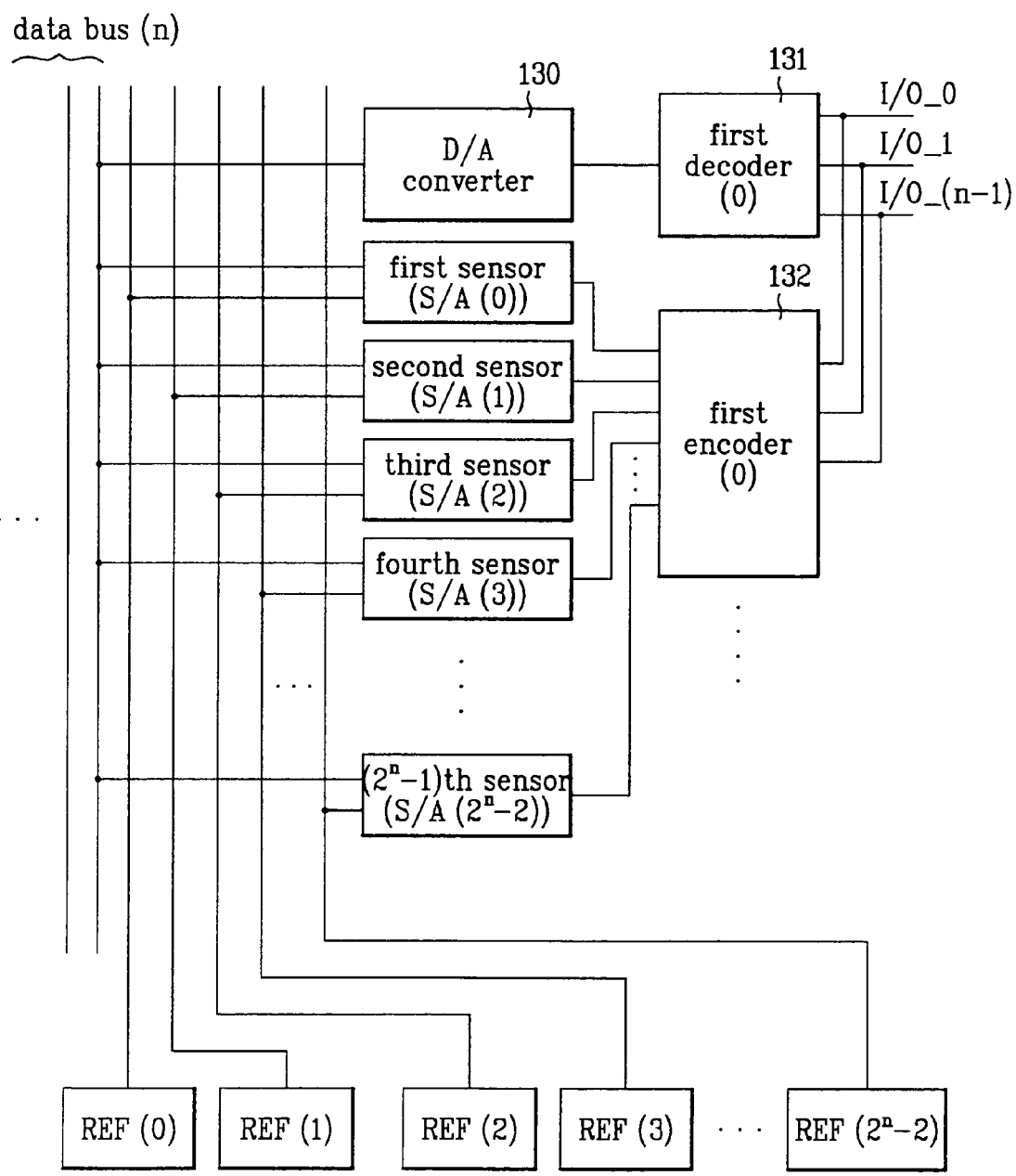
FIG. 13 is a block diagram of a sensing amplifier for sensing n-bit data stored in a cell.

The sensing amplifier for outputting the data stored in the cell in a n-bit type, as shown in FIG. 13, includes first to $(2^n-1)$th sensors S/A(0)~S/A($2^n$) comparing and outputting data from the data bus, and a first encoder 132 encoding signals output from the first to $(2^n-1)$th sensors S/A(0)~S/A($2^n$) to output them to first to nth input/output buses I/O_0~I/O_(n-1). A first decoder 131 outputs output signals of the first encoder 132 to a digital-to-analog converter 130 when restoring the data, and the digital-to-analog converter 130 outputs data of the first decoder 131 to the data bus.

Also, to sense the data using the first to $(2^n-1)$th sensors S/A(0)~S/A($2^n$), reference generators having different levels are required. Therefore, first to $(2^n-1)$th reference generators REF(0)~REF(($2^n-2$) outputting different levels are provided at input terminals of the first to $(2^n-1)$th sensors S/A(0)~S/A($2^n$).

A multiplicity of data buses are provided so that one data bus includes one digital-to-analog converter, the first to $(2^n-1)$th sensors S/A(0)~S/A($2^n$), the encoder, the decoder, and n number of input/output buses.

The reference generators shown in FIGS. 11 to 13 are described below.

Figure 14:
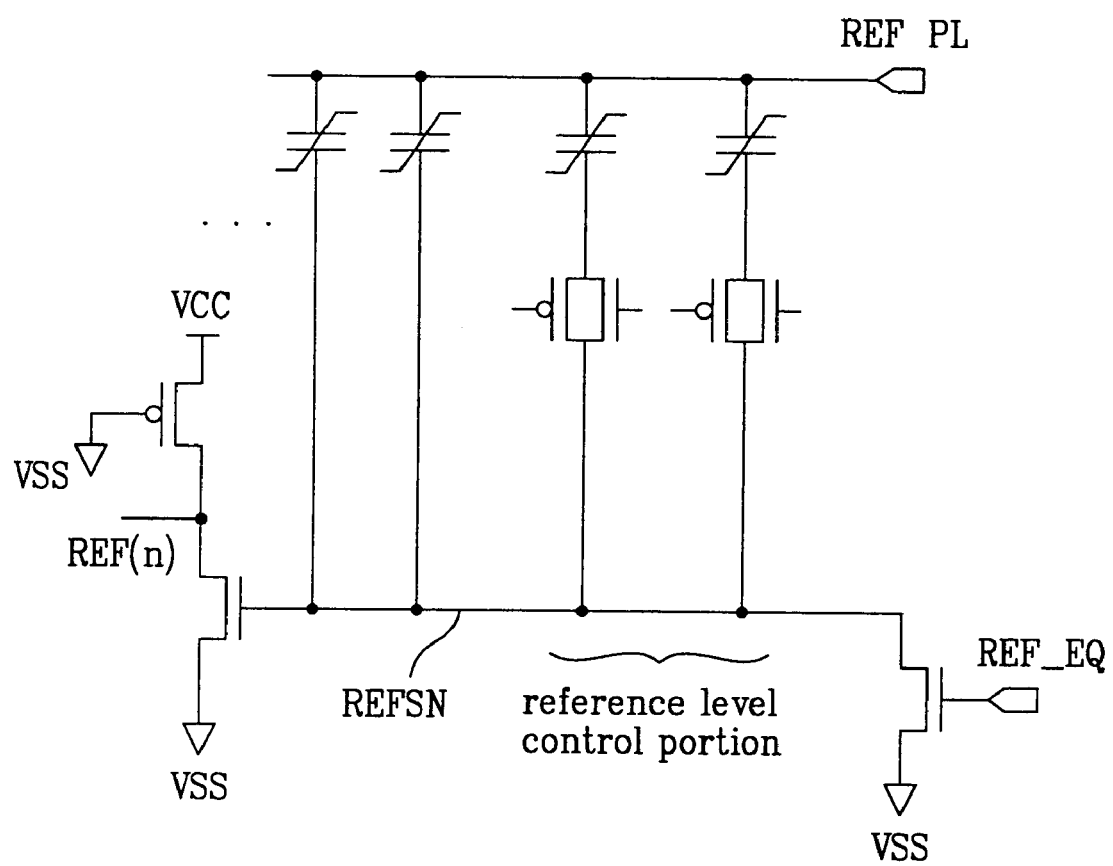
FIG. 14 is a circuit diagram of a reference generator of FIGS. 11 to 13.

Each of the reference generators, as shown in FIG. 14, includes multiple ferroelectric capacitors, a level initiating portion, a reference level control portion, and a reference level output portion.

The first electrodes of the multiple ferroelectric capacitors are commonly connected to the reference plate line REF_PL, and the second electrodes are commonly connected to a reference voltage sensing line, which is a storage node. The first electrodes and the second electrodes are arranged in parallel.

The reference level control portion includes a plurality of transfer gates. The transfer gates are arranged one by one between the second electrodes of the ferroelectric capacitor and the reference voltage sensing line to control the reference level change due to process change after an optimal ferroelectric capacitor is arranged.

FIG. 14 illustrates an optimal ferroelectric capacitor and the transfer gates arranged in each of two ferroelectric capacitors other than the optimal ferroelectric capacitor.

The reference equalizer signal REF_EQ inputs to a gate of the level initiating portion. A drain terminal of the level initiating portion and its source terminal connect with the reference voltage sensing line and the ground voltage terminal, respectively.

The reference voltage output portion includes a load PMOS transistor and an NMOS transistor connected in series between the power source terminal VCC and the ground voltage terminal VSS. A reference voltage REF(n) is generated in a common node between the PMOS transistor and the NMOS transistor.

At this time, a gate of the load PMOS transistor is grounded, and a gate of the NMOS transistor is turned on/off under the control of the reference voltage sensing line.

Figure 15:
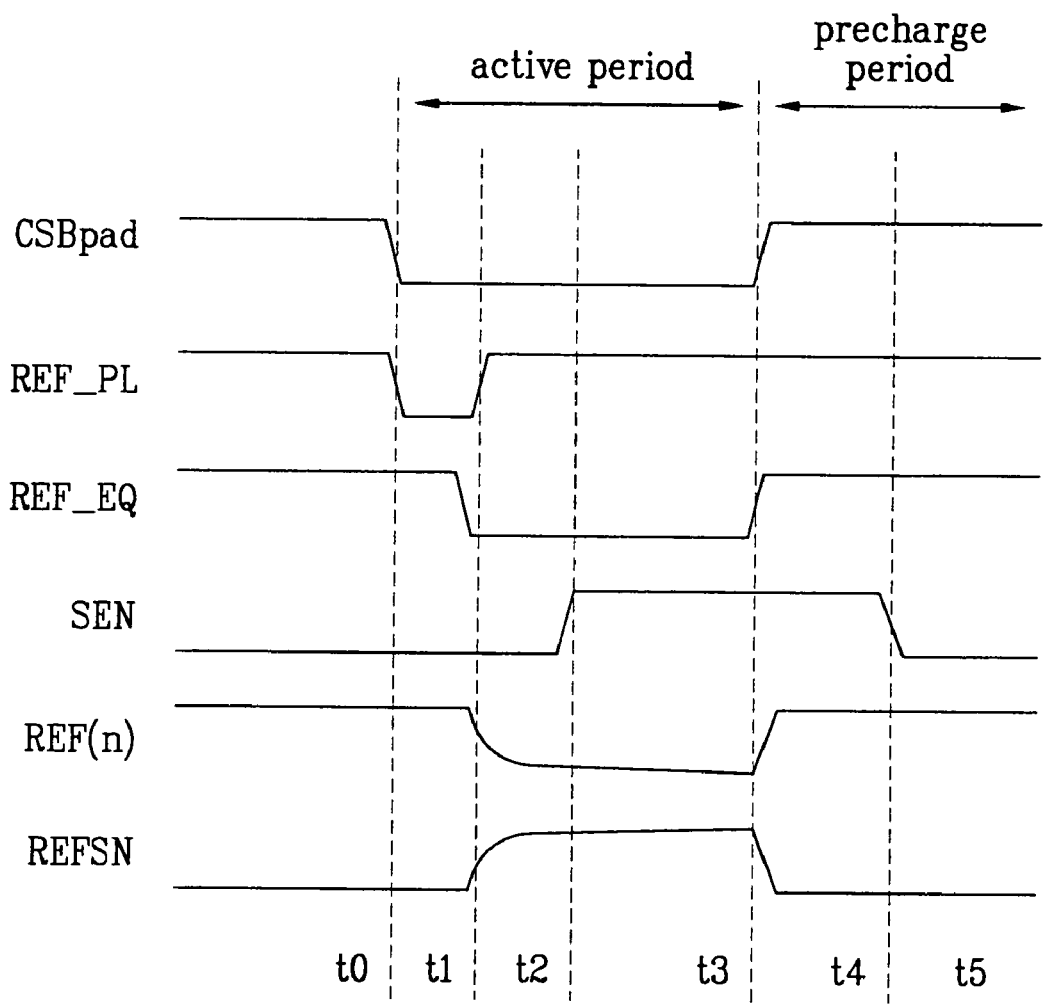
FIG. 15 is an operational timing diagram of a reference generator.

The operation of the reference generator will be described by dividing a timing period into an active period and a precharge period, as shown in FIG. 15.

The active period includes three periods t1, t2 and t3 while the precharge period includes three periods to, t4, and t5.

During the active period, a low signal outputs through a chip selection bar pad CSBpad. During the precharge period, a high signal outputs through a chip enable signal CSBpad.

During the period t0, the reference plate line REF_PL is maintained at high level, and the reference equalizer signal REF_EQ is high. Accordingly, the reference voltage sensing node REFSN is maintained at low level and the REF(n) is maintained at high level.

Afterwards, in the period t1, the reference plate line REF_PL is maintained at low level and the reference equalizer signal REF_EQ is maintained at high level. Accordingly, the reference voltage sensing node REFSN is maintained at low level and the REF(n) is maintained at high level, so that a reference voltage charges in the ferroelectric capacitor.

In the period t2, the reference plate line REF_PL transits to high level and the reference equalizer signal REF_EQ transits to low level. Accordingly, the reference voltage sensing node REFSN is maintained at high level and the REF(n) is output at low level.

During the period t3, the same signal as that of the period t2 is output. However, during the period t3, the sensing enable signal SEN is output at high level to sense the reference voltage.

The method for storing multiple bit data using the nonvolatile ferroelectric memory device according to the invention is described below.

First, the concept for storing/sensing data of 2-bit, 3-bit, and n-bit in a cell using current sensing is described.

Figure 16A:
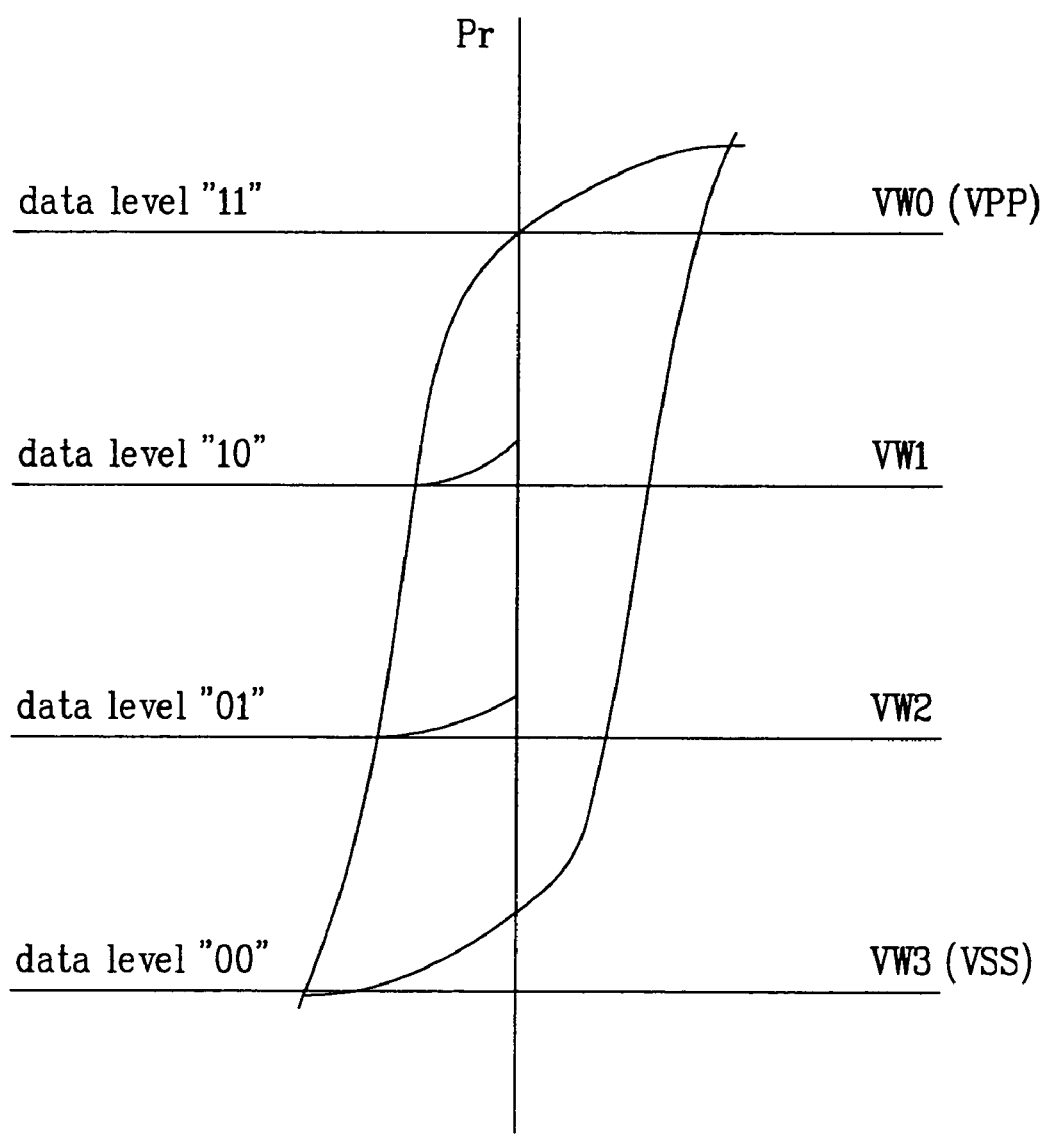
FIG. 16A is a conceptional view of a hysteresis loop for storing 2-bit data in a cell.

When 2-bit data is stored in a cell, 4 data levels should be stored in the cell, as is shown in FIG. 16A. That is, four levels of 00, 01, 10, and 11 are required in the cell. To this end, voltage levels VW0, VW1, VW2, and VW3 are separately stored in the cell. A method of writing the respective levels in the cell is described below.

In the state when the cell transistor is turned on and a ground voltage VSS is applied to a plate line PL, a sub bitline SBL and a main bitline are controlled so that the data level of '11' is written in all the cells at a voltage of VW0 (i.e., VPP). Then, to store the data level of '10' in the cell, the voltage of VPP is applied to the plate line PL and the voltage of VW1 is applied to the SBL and the MBL.

Since the voltage of VW0–VW1 is applied to the plate line and the SBL, the originally stored charge is transferred as much as the corresponding voltage difference, so that the data level is changed from '11' to '10'.

To store the data level of '01' in the cell, the voltage of VW2 is applied to the SBL and the MBL in a state that the voltage of VPP is applied to the plate line PL. In this case, since the voltage of VW1–VW2 is applied to the plate line PL and the SBL, the previously stored charge is transferred as much as the corresponding voltage difference, so that the data level is changed from '10' to '01'.

To store the data level of '00' in the cell, the voltage of VW3 (i.e., VSS) is applied to the SBL and the MBL in a state that the voltage of VPP is applied to the plate line PL. In this case, since the voltage of VW2–VW3 is applied to the plate line PL and the SBL, the previously stored charge is transferred as much as the corresponding voltage difference, so that the data level is changed from '01' to '00'.

Assuming that a charge corresponding to 3Q is stored in the ferroelectric capacitor at the data level of '11', a charge corresponding to 2Q is stored in the ferroelectric capacitor at the data level of '10', a charge corresponding to 1Q is stored in the ferroelectric capacitor at the data level of '01', and a charge corresponding to 0Q is stored in the ferroelectric capacitor at the data level of '00'.

The voltages VW0~VW3 show the voltage applied to both electrodes of the capacitor.

For reference, the output of the encoder of FIG. 11 is fed back to the decoder and the fed back signal is divided into four levels VW0~VW3 through the D/A converter.

The sensing level of a 2-bit storage cell having a hysteresis curve (see FIG. 16A) obtained by the above operation during a read mode is described below.

Figure 16B:
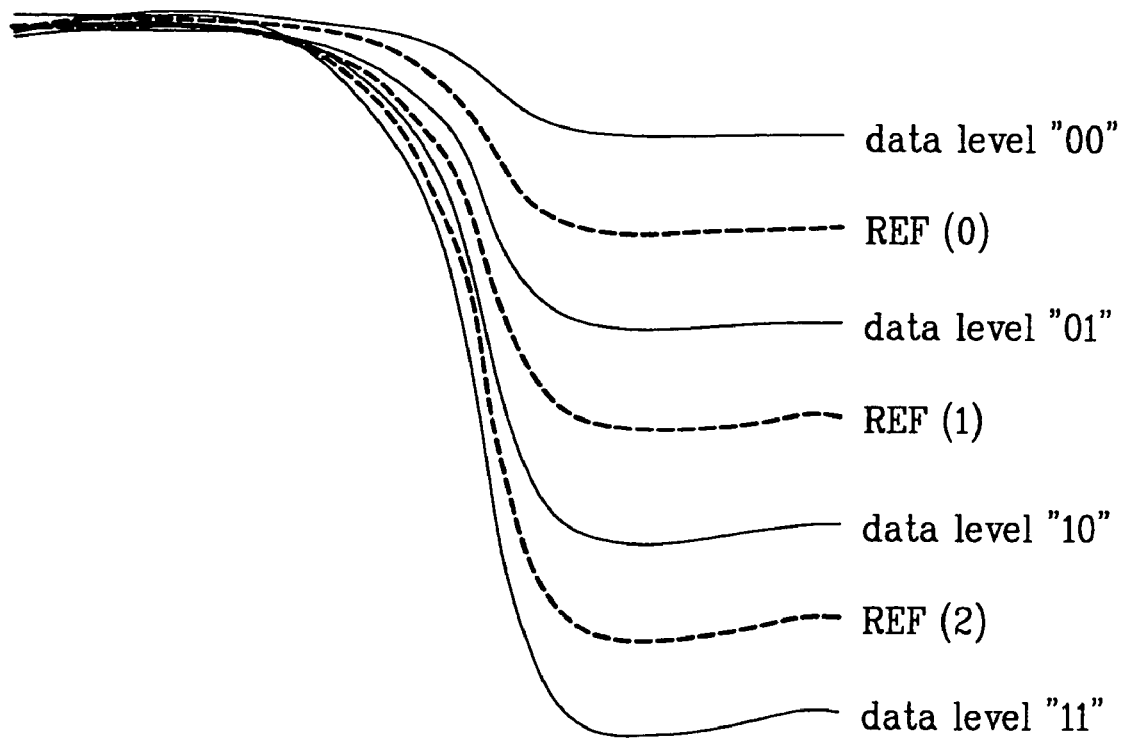
FIG. 16B is a conceptional view of a sensing level for sensing data of a cell having 2 bit data.

Four different sensing voltages are applied to the sub bitline SBL depending on the data level stored in the cell. The sensing voltage of the SBL, as shown in FIG. 16B, is represented by four data levels in the main bitline MBL. The four data levels are compared with three reference levels and then amplified.

In FIG. 16B, the reference levels are represented by first to third reference levels REF(0), REF(1), and REF(2), and the third reference level REF(2) has the greatest size and the second reference level REF(1) is greater than the first reference level REF(0) (i.e., REF(0)<REF(1)<REF(2)).

Referring to FIG. 16B, when the 2-bit data is stored in the cell, the current value in the fourth switching transistor ST4 depends on four different sensing voltages transferred to the SBL. Thus, four different data levels '11', '10', '01', and '00' are represented in the MBL.

At this time, as shown in FIG. 16, if the sensing level transferred to the MBL is greater than the REF(2), the data level '11' is sensed. If the sensing level is smaller than the REF(2) and greater than the REF(1), the data level '10' is sensed. If the sensing level is smaller than the REF(1) and greater than the REF(0), the data level '01' is sensed. If the sensing level is smaller than the REF(0), the data level '00' is sensed.

Next, when 3-bit data is stored in the cell, eight data levels are required.

In other words, storage levels of 000, 001, 010, . . . , 111 are required. To this end, the voltages of VW0, VW1, VW2, . . . , VW7 are separately stored in the cell.

A method of writing the respective levels is described below.

First, the ground voltage VSS is applied to the plate line PL after the cell transistor is turned on, and the sub bitline SBL and the main bitline MBL are controlled so that data corresponding to the voltage VW0 (i.e., VPP) is written in all the cells. Thus, the data level of '111' is stored.

Next, to store the data level of '110', the VPP is applied to the plate line PL, and the voltage VPP is adjusted to the voltage VW1 so that the voltage VW1 is applied to the SBL and the MBL.

In this case, since the voltage of 'VW0–VW1' is applied to the plate line and the SBL, the originally stored charge is transferred as much as a corresponding voltage difference. Thus, the data level is changed from '111' to '110'.

To store the data level of '101', the voltage VW2 is applied to the SBL and the MBL in a state that the VPP is applied to the plate line PL. In this case, since the voltage of 'VW1–VW2' is applied to the plate line PL and the SBL, the previously stored charge is transferred as much as a corresponding voltage difference. Thus, the data level is changed from '110' to '101'.

To store the data level of '100', the voltage VW3 is applied to the SBL and the MBL, and the VPP is applied to the plate line PL. In this case, since the voltage of 'VW2–VW3' is applied to the plate line PL and the SBL, the previously stored charge is transferred as much as a corresponding voltage difference. Thus, the data level is changed from '101' to '100'.

Figure 17A:
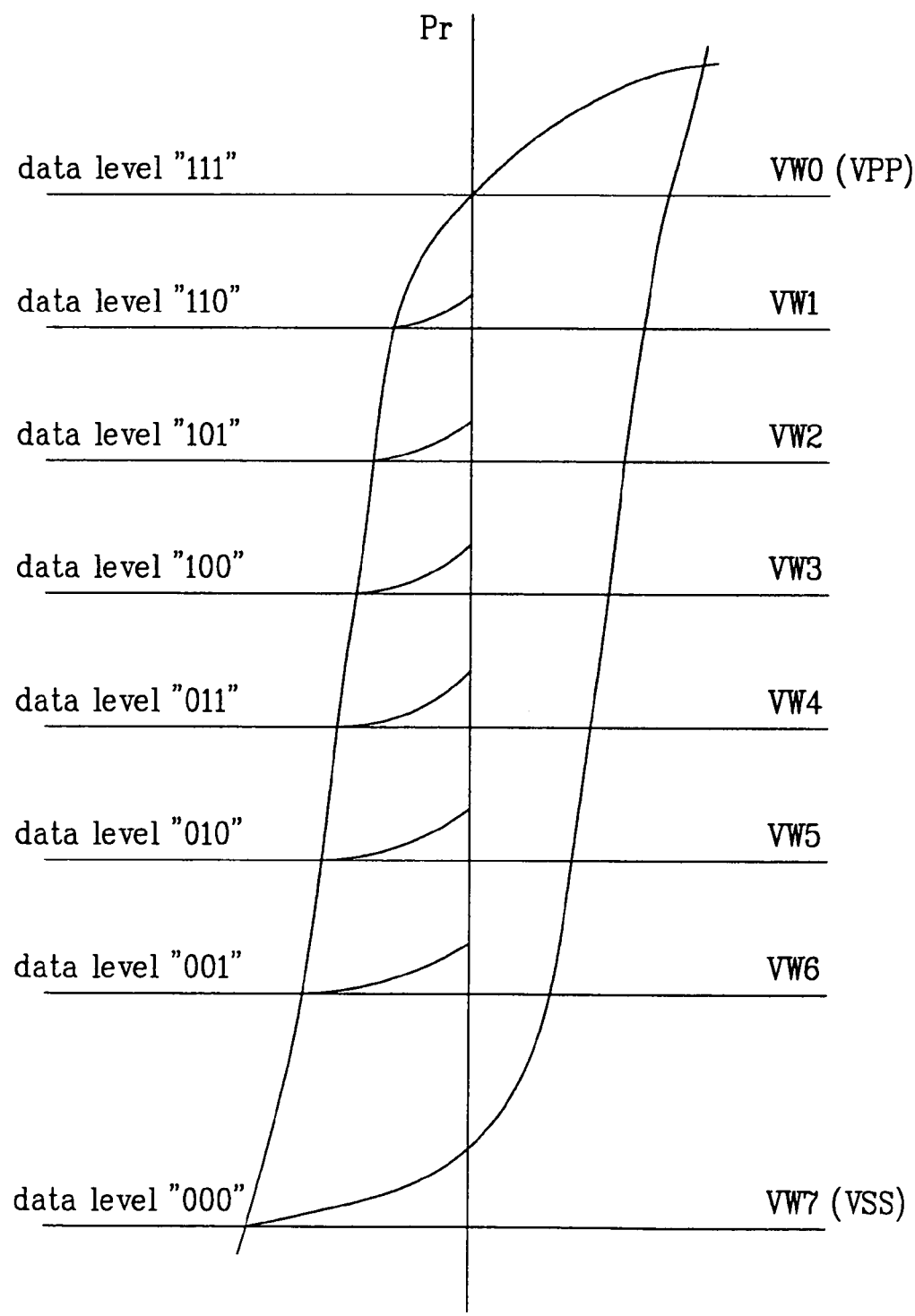
FIG. 17A is a conceptional view of a hysteresis loop for storing 3-bit data in a cell.

As described above and shown in FIG. 17A, when the VPP is applied to the plate line PL, the voltages VW3 to VW7(VSS) are sequentially applied to the SBL and the MBL, so that the data level is transited from '011' to '000'.

For example, to write one of the multiple data levels, such as '011', in the cell, the plate line PL is transferred to the VPP under the data level of '111', and the voltage of VW4 is applied to the SBL and the MBL.

If a charge of 7Q is stored in the ferroelectric capacitor at the data level of '111', a charge of 6Q is stored in the ferroelectric capacitor at the data level of '110' and a charge of 5Q is stored in the ferroelectric capacitor at the data level of '101'. Finally, a charge of 0Q is stored in the ferroelectric capacitor at the data level of '000'.

The voltages VW0~VW7 represent the state of the voltages applied to both electrodes of the capacitor.

For reference, during writing/restoring operation, the output of the encoder of FIG. 12 is fed back to the decoder and the fed back signal is divided into eight levels VW0–VW7 through the D/A converter.

The sensing level of a 3-bit storage cell having a hysteresis curve obtained by the above operation during a read mode will is described below.

Eight different sensing voltages are applied to the sub bitline SBL depending on the data levels stored in the cell.

Figure 17B:
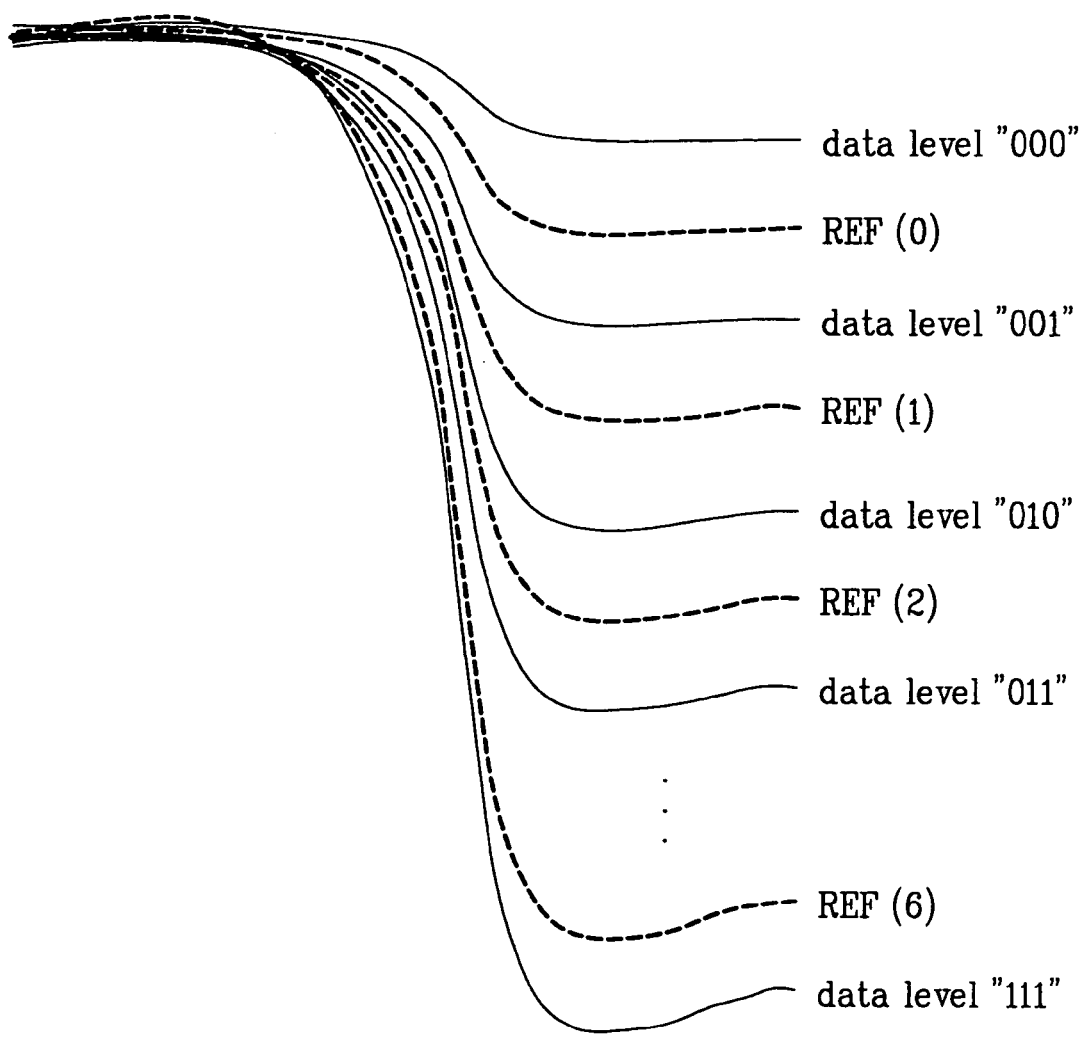
FIG. 17B is a conceptional view of a sensing level for sensing data of a cell having 3 bit data.

The sensing voltage of the SBL is represented by eight data levels in the main bitline MBL as shown in FIG. 17B. The eight data levels are compared with seven reference levels and then amplified.

At this time, the reference levels can be represented by first to seventh reference levels REF(0) to REF(6), and their sizes are determined by REF(0)<REF(1)<REF(2)<REF(3)<REF(4)<REF(5)<REF(6).

That is, referring to FIG. 17B, when the 3-bit data is stored in the cell, the current value in the fourth switching transistor ST4 depends on eight different sensing voltages transferred to the SBL. Thus, eight different data levels '111', "110", "101", "100", "011", "010", "001", and "000" are represented in the MBL.

At this time, as shown in FIG. 17B, if the sensing level transferred to the MBL is greater than the REF(6), the data level '111' is sensed. If the sensing level is smaller than the REF(3) and greater than the REF(2), the data level '011' is sensed. If the sensing level is smaller than the REF(2) and greater than the REF(1), the data level '010' is sensed. If the sensing level is smaller than the REF(1) and greater than the REF(0), the data level '001' is sensed. If the sensing level is smaller than the REF(0), the data level '000' is sensed.

Figure 18A:
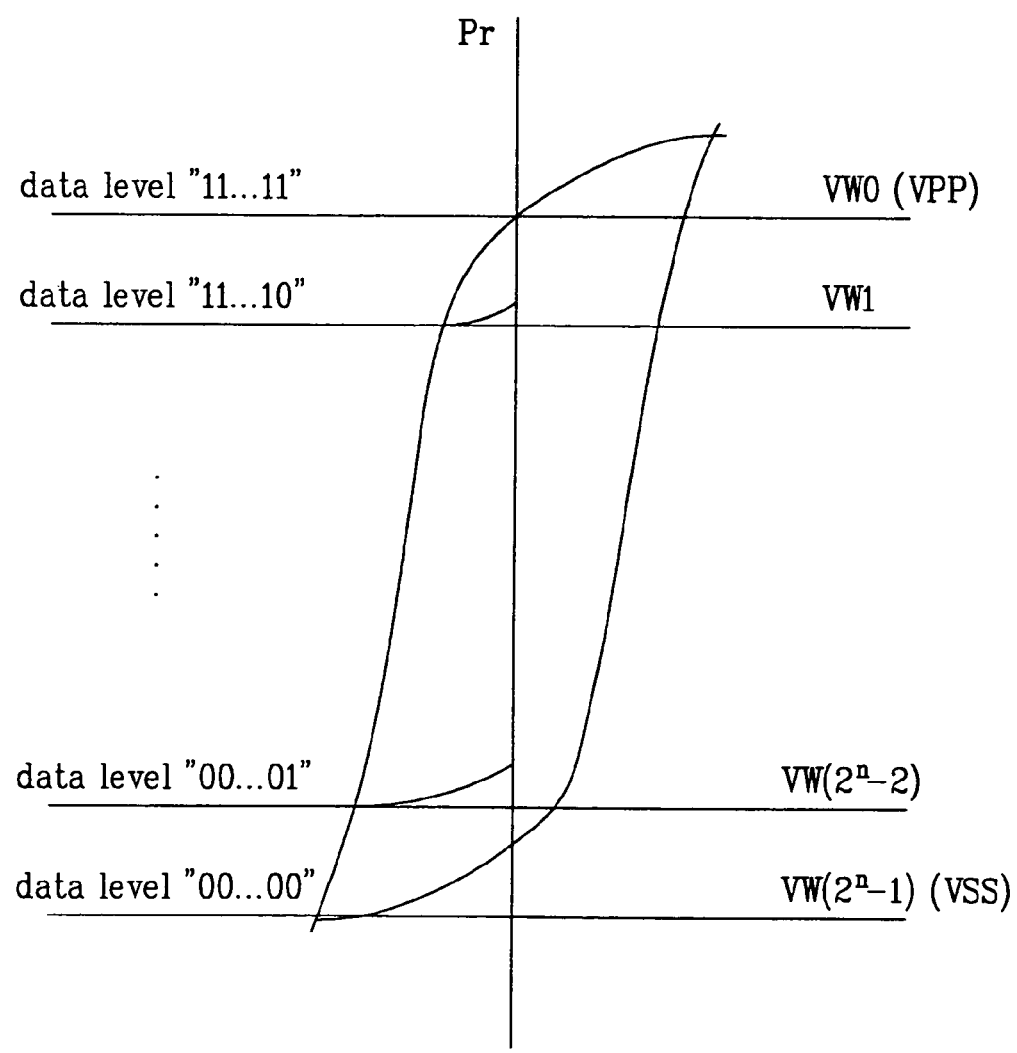
FIG. 18A is a conceptional view of a hysteresis loop for storing n-bit data in a cell.

Next, as shown in FIG. 18A, when n-bit data is stored in the cell, $2^n$ data levels are required. In other words, storage levels of 00..00, 00..01, . . . , 11..10, 11..11 are required. To this end, the voltages of VW0, VW1, VW2, VW3 . . . , VW($2^n$-1) are separately stored in the *cell*.

A method of writing the respective levels is described below.

First, when the ground voltage VSS is applied to the plate line PL after the cell transistor is turned on, the sub bitline SBL and the main bitline MBL are controlled so that data corresponding to the voltage of VW0(i.e., VPP) is written in all the cells. Thus, the data level of '11..11' is stored.

Next, to store the data level of '11..10', the VPP is applied to the plate line PL, and the voltages VPP to VW1 are applied to the SBL and the MBL.

In this case, since the voltage of 'VW0–VW1' is applied to the plate line and the SBL, the originally stored charge is transferred as much as a corresponding voltage difference. Thus, the data level is changed from '11..11' to '11..10'.

As described above, when the VPP is applied to the plate line PL, the voltages VW2 to VW($2^n$-1) (i.e., VSS) are sequentially applied to the SBL and the MBL, so that the data level is changed from '11..01'to '00..00'.

For example, to write one of the multiple data levels, such as '00..01', in the cell, the plate line PL is switched to the VPP under the data level of '11..11', and a voltage of VW($2^n$-2) is applied to the SBL and the MBL.

If a charge of $2^n$Q is stored in the ferroelectric capacitor at the data level of '11..11', then a charge of ($2^n$-1)Q is stored in the ferroelectric capacitor at the data level of '11..10'. Finally, a charge of 0Q is stored in the ferroelectric capacitor at the data level of '00..00'.

The voltages VW0~VW($2^n$-1) represent the state of the voltages applied to both electrodes of the capacitor.

For reference, during writing/restoring operation, the output of the encoder of FIG. 13 is fed back to the decoder and the fed back signal is divided into $2^n$ levels VW0~VW($2^n$-1) through the D/A converter.

The sensing level of an n-bit storage cell having a hysteresis curve obtained by the above operation during a read mode is described below.

Here, $2^n$ different sensing voltages are applied to the sub bitline SBL depending on the data levels stored in the cell.

Figure 18B:
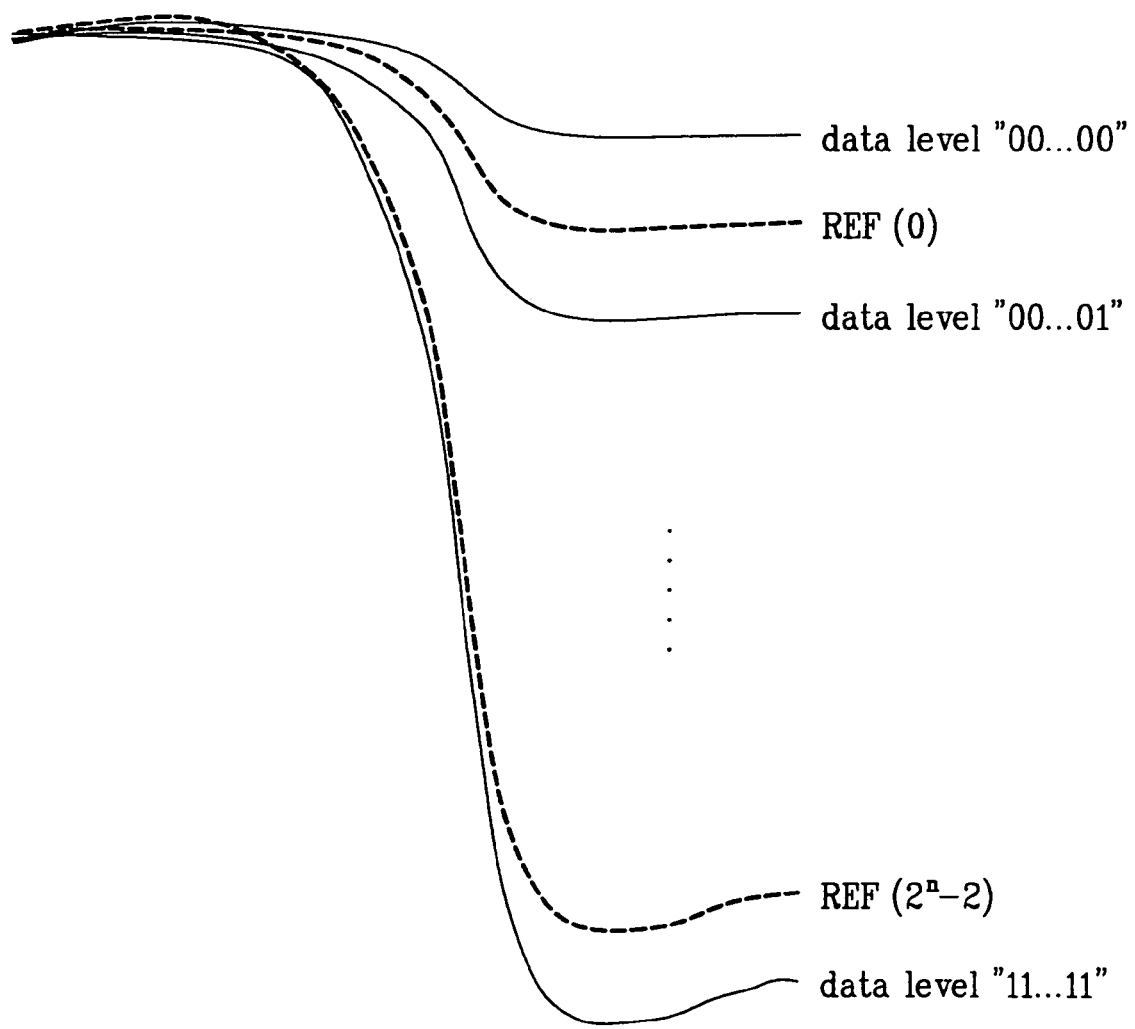
FIG. 18B is a conceptional view of a sensing level for sensing data of a cell having n bit data.

The sensing voltage of the SBL is represented by $2^n$ data levels in the main bitline MBL as shown in FIG. 18B. The $2^n$ data levels are compared with $2^n$-1 reference levels and then amplified. The reference levels can be represented by first to ($2^n$-1)th reference levels REF(0) to REF($2^n$-2), and their sizes are determined by REF(0)<REF(1)<REF(2)< . . . <REF($2^n$-2).

That is, referring to FIG. 18B, when the n-bit data is stored in the cell, the current value in the fourth switching transistor ST4 depends on $2^n$ different sensing voltages transferred to the SBL. Thus, $2^n$ different data levels '11..11',~, '00..00' are represented in the MBL.

At this time, as shown in FIG. 18B, if the sensing level transferred to the MBL is greater than the REF($2^n$-2), then the data level '11..11' is sensed. If the sensing level is smaller than the REF(0), then the data level '00..00' is sensed.

Next, the write mode operation and the read mode operation of the multiple-bit data according to the present invention will be described with reference to FIGS. 19 and 20.

For read and write operations of the invention, FRAM cell array includes a plurality of sub cell array blocks provided with sub bitlines and main bitlines.

The voltage stored in the cell is applied to the gate terminal of the fourth switching transistor ST4 through the sub bitline, so that the current value in the fourth switching transistor ST4 is varied depending on the multiple-level value of the cell data. Thus, the data of the cell can be sensed by comparing the voltage of the main bitline connected to the drain terminal of the fourth switching transistor ST4 with a plurality of reference values.

The multi-level write mode operation of the nonvolatile ferroelectric memory device according to the present invention is described below.

One cycle of the operation in the cell includes an active period and a precharge period. The active period is activated when the CSB is low. The precharge period is activated when the CSB is high.

The whole operational timing periods are t0~t7. The period to denotes the precharge period while the periods t1~t7 denote successive active periods.

Figure 19:
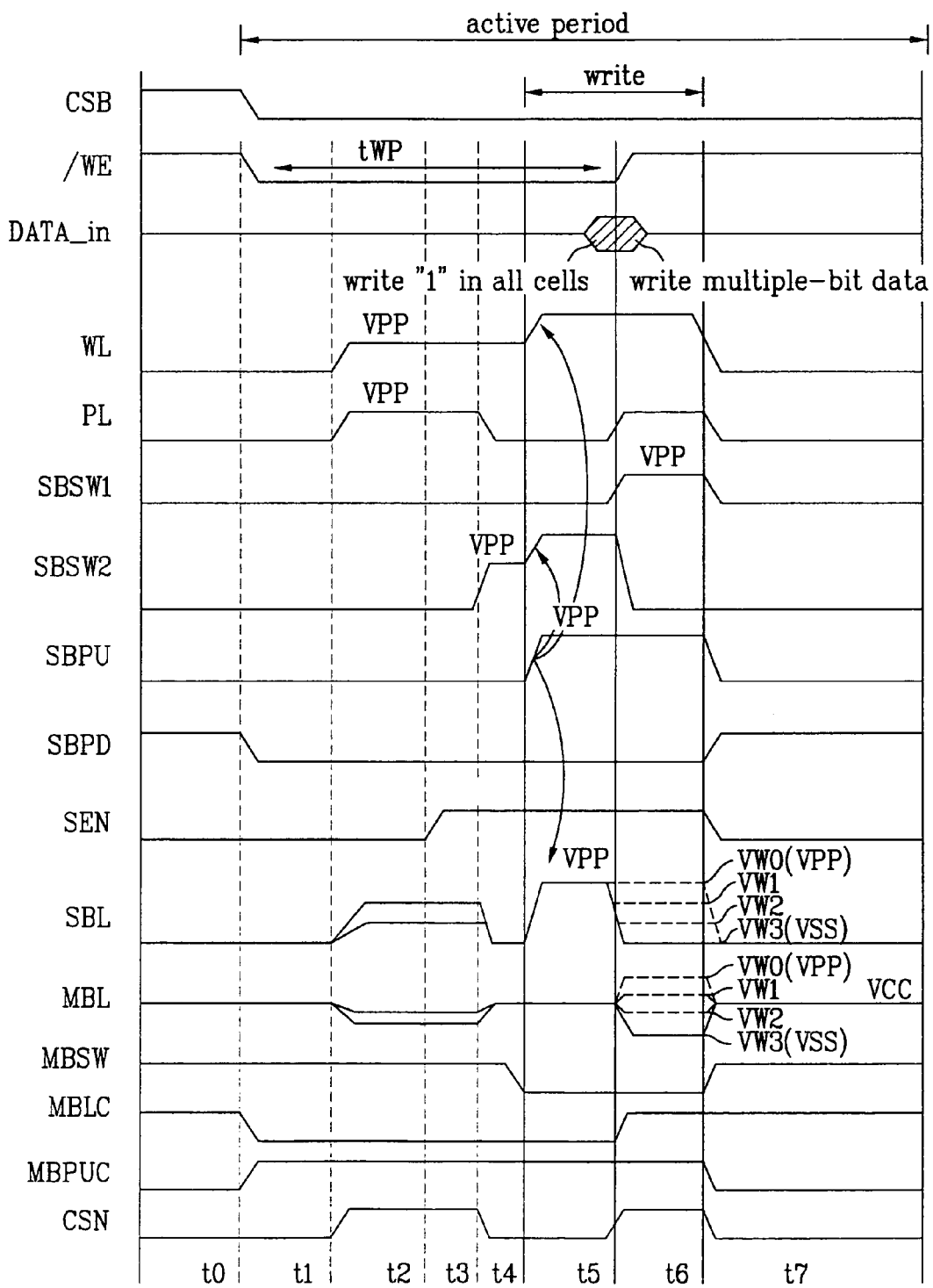
FIG. 19 is a timing diagram of a write mode operation of a nonvolatile ferroelectric memory device according to the invention.
Figure 20:
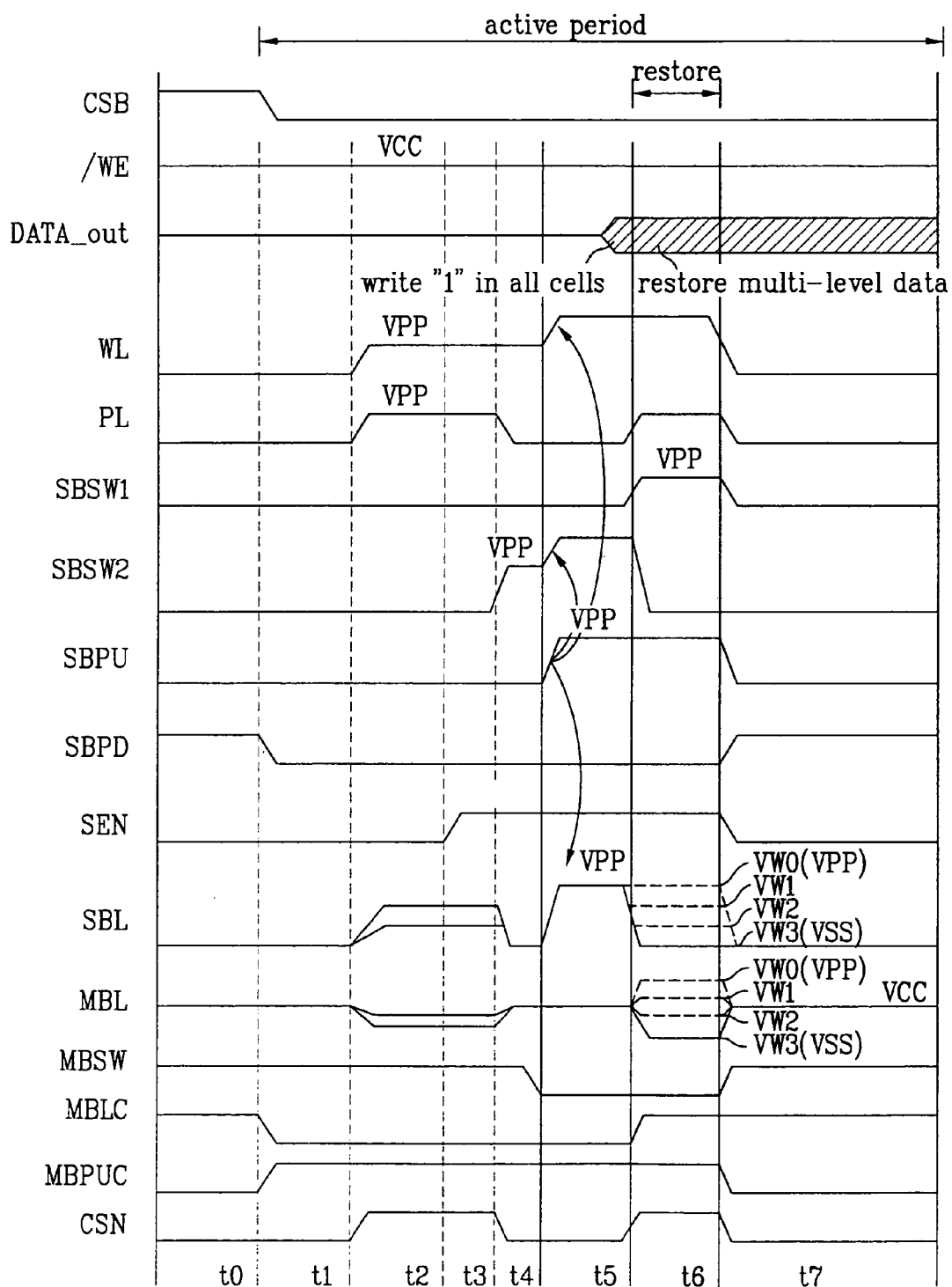
FIG. 20 is a timing diagram of a read mode operation of a nonvolatile ferroelectric memory device according to the invention.

As shown in FIG. 19, during the period to, VCC is applied to the sub bitline pull-down SBPD line to apply a voltage of 0V to the sub bitline SBL. At this time, the voltage of 0V is applied to the wordline WL, the plate line PL, the first and second sub bitline switching signal lines SBSW1 and SBSW2, the sub bitline pull-up signal SBPU line, the sensing amplifier enable signal SEN line, the main bitline pull-up control signal MBPUC line, and a CSN (see FIG. 10) controlling the NMOS transistor of the column selector.

A high voltage level is applied to the SBPD and the main bitline load control signal line.

During the period t1, in which the active period starts, the CSB line, the SBPD line, and the main bitline load control signal MBLC line transit from high level to low level, the MBPUC (see FIG. 9) transits to high level, and the signal of the period t0 is maintained in the other lines.

In the period t2, a VPP voltage is applied to the wordline WL and the plate line PL, and the voltage of the period t1 is maintained in the other lines.

Thus, the sub bitline SBL transits to high level. The fourth switching transistor ST4 is turned on so that the main bitline MBL transits to low level.

In the period t3, the wordline WL and the plate line PL are maintained at VPP, the sensing amplifier is enabled by applying VCC to SEN, and the signal of the period t2 is maintained in the other lines.

In the periods t2 and t3, the fourth switching transistor ST4 is turned on to sense the data stored in the cell.

In the period t4, the wordline WL is maintained at VPP, the plate line PL transits from VPP to 0V, and the second sub bitline switching signal SBSW2 line transits from 0V to VPP. 0V is applied to the sub bitline pull-up SBPU line so that the sub bitline SBL is maintained at low level of 0V.

At this time, the SBSW2 transits to VPP in advance in the period t4 to write data of logic value "1" in the ferroelectric capacitors of all the unit cells by self-boosting the wordline and the SBSW2 to 2VPP in the period t5.

In the period t5, the data of logic value "1" is written in all the cells.

In the period t4, the SBSW2 is maintained at VPP, the SBPU is maintained at 0V, and the SBL is floating. In this case, once the SBPU transits to VPP, the SBL transits to VPP and the SBSW2 and the WL are self-boosted to 2VPP.

At this time, the main bitline switching signal MBSW transits to low level.

Thus, VPP is applied to the ferroelectric capacitor of the selected cell which received VPP signal of the SBL.

In the periods t4 and t5, CSN transits to low level so that the main bitline is pulled up at high level using a low signal of the MBLC line regardless of data of the data bus.

In the period t6, multiple-bit data is written. For example, 2-bit data is written (stored) in the cell.

High level is applied to the MBLC line before the write mode operation is performed, so that the main bitline load controller is turned off.

At this time, the WL transits to 2VPP, the PL to VPP, the SBSW1 to VPP, and the SBSW2 to 0V. Also, the SBPU is maintained at VPP level, and the SEN is maintained at VCC level.

As described above, the SBSW1 is maintained at 0V during the whole periods and transits to VPP only in the period t6 where the multiple-level data is written, so that the first switching transistor ST1 is turned on (see FIGS. 7 and 8).

While VPP is applied to the plate line and the first switching transistor ST1 is turned on, the multiple-level voltage such as VW0(VPP), VW1, VW2, and VW3(VSS) is applied to the main bitline MBL and the sub bitline. In this case, 2-bit data such as '11', '10', '01', and '00' corresponding to 'VW0(VPP)', 'VW1', 'VW2', and 'VW3(VSS)' can be written in the cell.

As described above, after high data is written in all the cells in the period t5, the voltages of the plate line and the sub bitline are controlled depending on the data level to be written, so that the multiple-level data is written.

Next, in the period t7, the same operation as that of the period t0 is performed.

In the above operation, since the boosted voltage higher than the VCC is used as the high voltage of the SBPU, the voltage used in the cell becomes higher even in the low voltage operation mode, thereby permitting a low voltage operation lower than 1.0V.

The cell operation time and the cycle time can be reduced by removing the time required for high data subsequent to amplification of the sensing amplifier.

Even if the capacitance load of the main bitline is high, good sensing margin can be obtained by sensing current in the main bitline. Also, even if capacitance mismatching of the main bitline is generated, good sensing margin can be obtained.

The read mode operation of the nonvolatile ferroelectric memory device according to a preferred embodiment of the invention is described below.

The read mode operation is almost similar to the write mode operation except that a write enable bar signal/WE is output at VCC level, and data of the cell is output to the data bus without being written in the cell.

The periods t2 and t3 are sensing periods, the period t5 is a high data write mode period, and the period t6 is a multiple-level restore period.

The read mode operation of the invention is performed in such a manner that the voltage induced in the cell is applied to the gate of the fourth switching transistor through the sub bitline, and the current applied to the main bitline is controlled depending on the data level stored in the cell to transfer the multiple-level voltage to the main bitline.

As described above, if the multiple-level data is transferred to the main bitline, the status of the cell is sensed by the sensing amplifier and the reference generator of FIGS. 11 to 13.

The sensing of the data transferred to the main bitline is described with reference to FIGS. 16B, 17B, 18B, and 11 to 13.

Next, the period t6 will be described.

While the SBSW1 is maintained at VPP and the first switching transistor is turned on, the multiple-level is respectively applied to the SBL and the MBL by the feedback decoder loop, and the applied multiple-level data is restored in the memory cell.

Before performing the restoring operation, in the periods t4 and t5, CSN transits to low level so that the main bitline is pulled up at high level using the low signal of the MBLC line regardless of data of the data bus.

The aforementioned nonvolatile ferroelectric memory device and the method for writing and reading multiple-bit data using the same have the following advantages.

Since more than 2-bit data can be stored in one memory cell, the size of a chip can remarkably be reduced. Thus, it is easy to obtain price competitiveness of the chip.

It is to be understood that the foregoing descriptions and specific embodiments shown herein are merely illustrative of the best mode of the invention and the principles thereof, and that modifications and additions may be easily made by those skilled in the art without departing for the spirit and scope of the invention. Thus, it is intended that the present invention covers the modifications and variations of this invention provided they come within the scope of the appended claims and their equivalents.

What is claimed is:

1. A method for writing multiple-bit data, which comprises:
providing a nonvolatile ferroelectric memory device comprising a plurality of cell array blocks provided with a plurality of sub cell array blocks having a plurality of unit cells controlled by a plate line and a wordline, a plurality of main bitlines arranged in the sub cell array blocks in one direction for each unit of column, a plurality of sub bitlines connected with one terminal of the unit cells and arranged along the main bitlines, switching transistors respectively arranged per sub bitline so that a gate is connected to the sub bitlines and a drain is connected to the main bitlines, and a sensing amplifier block consisting of a plurality of sensing amplifiers commonly used in the cell array blocks, transferring voltages corresponding to the data stored in the cells to the main bitlines by current sensing through the switching transistors and sensing the voltages transferred to the main bitlines in a multiple-bit state;
writing high data in all the cells; and
controlling voltages of the plate line and the sub bitlines to write multiple-bit data of n-bit in the cells.

2. The method of claim 1, wherein the step of writing high data in all the cells includes the steps of:
a) applying a first voltage to a pull-up signal line connected to one end of a pull-up transistor by turning on a pull-up transistor which pulls up the sub bitlines;
b) applying a second voltage to the wordline to turn on the cells simultaneously with the step a); and
c) applying the first voltage to the sub bitlines simultaneously with the step a) to transfer the first voltage level to all the cells.

3. The method of claim 1, wherein the data are written in the cells at $2^n$ storage levels of 00..00, 00..01, ..., 11..10, 11..11 when the multiple-bit is n-bit.

4. The method of claim 3, wherein 11..11 of the $2^n$ storage levels is high data written in all the cells.

5. The method of claim 3, wherein 11..10 of the $2^n$ storage levels is written in such a manner that the first voltage is applied to the plate line and the second voltage obtained by dividing the first voltage and a ground voltage by n number of first to nth voltages is applied to the sub bitline and the main bitlines.

6. The method of claim 3, wherein 00..01 of the $2^n$ storage levels is written in such a manner that a $(2^n-1)$th obtained by dividing the first voltage VPP and a ground voltage by n number of first to nth voltages is applied to the sub bitline and the main bitlines in a state that the first voltage is applied to the plate line.

7. The method of claim 3, wherein 00..00 of the $2^n$ storage levels is written in such a manner that the nth voltage obtained by dividing the first voltage and a ground voltage by n number of first to nth voltages is applied to the sub bitline and the main bitlines in a state that the first voltage is applied to the plate line.

8. The method of claim 1, wherein the data are written in the cells at four storage levels of 00, 01, 10, 11 when the multiple-bit is 2-bit.

9. The method of claim 8, wherein 11 of the four storage levels is high data written in all the cells.

10. The method of claim 8, wherein 10 of the four storage levels is written in such a manner that the first voltage is applied to the plate line and the second voltage smaller than the first voltage is applied to the sub bitline and the main bitlines.

11. The method of claim 8, wherein 01 of the four storage levels is written in such a manner that the third voltage smaller than the second voltage is applied to the sub bitline and the main bitlines in a state that the first voltage is applied to the plate line.

12. The method of claim 8, wherein 00 of the four storage levels is written in such a manner that the fourth voltage smaller than the third voltage is applied to the sub bitline and the main bitlines in a state that the first voltage is applied to the plate line.

13. A method for reading multiple-bit data, comprising:
providing a nonvolatile ferroelectric memory device comprising a plurality of cell array blocks provided with a plurality of sub cell array blocks having a plurality of unit cells controlled by a plate line and a wordline, a plurality of main bitlines arranged in the sub cell array blocks in one direction for each unit of column, a plurality of sub bitlines connected with one terminal of the unit cells and arranged along the main bitlines, switching transistors respectively arranged per sub bitline so that a gate is connected to the sub bitlines and a drain is connected to the main bitlines, and a sensing amplifier block consisting of a plurality of sensing amplifiers commonly used in the cell array blocks to sense voltages transferred to the main bitlines;
comparing a voltage value of a multiple-level transferred to the main bitlines with an output value of $2^n-1$ reference generators through first to $(2^n-1)$th sensors;
encoding output signals of the sensors and outputting the encoded signals in n-bit; and
decoding a data value of the encoded n-bit, digital-to-analog converting the decoded value and restoring the resultant value to the cells through the main bitlines and the sub bitline.

14. The method of claim 13, wherein the voltage value transferred to the main bitline is determined by transmitting the data value of n-bit stored in the cells to the sub bitline at a voltage value of $2^n$ level and varying a current value in the switching transistors which received the voltage value of $2^n$ level.

* * * * *